US010097135B2

(12) United States Patent
Pisharodi

(10) Patent No.: US 10,097,135 B2
(45) Date of Patent: Oct. 9, 2018

(54) PHOTOVOLTAIC SYSTEMS WITH INTERMITTENT AND CONTINUOUS RECYCLING OF LIGHT

(71) Applicant: Madhavan Pisharodi, Brownsville, TX (US)

(72) Inventor: Madhavan Pisharodi, Brownsville, TX (US)

(73) Assignee: Perumala Corporation, Brownsville, TX (US)

( * ) Notice: Subject to any disclaimer, the term of this patent is extended or adjusted under 35 U.S.C. 154(b) by 0 days.

(21) Appl. No.: 15/455,329

(22) Filed: Mar. 10, 2017

(65) Prior Publication Data

US 2017/0187322 A1    Jun. 29, 2017

Related U.S. Application Data

(63) Continuation-in-part of application No. 15/149,506, filed on May 9, 2016, which is a continuation-in-part
(Continued)

(51) Int. Cl.
*H02S 40/22* (2014.01)
*H02S 10/12* (2014.01)
(Continued)

(52) U.S. Cl.
CPC ............. *H02S 40/22* (2014.12); *F24S 23/12* (2018.05); *H01L 31/0547* (2014.12);
(Continued)

(58) Field of Classification Search
CPC ....... H02S 40/22; H02S 10/12; H01L 31/0547
(Continued)

(56) References Cited

U.S. PATENT DOCUMENTS 2,506,625 A * 5/1950 Woolley ................. H01J 40/04
131/254
4,080,221 A    3/1978 Manelas
(Continued)

FOREIGN PATENT DOCUMENTS

FR    2961023    12/2011

OTHER PUBLICATIONS

Written opinion and search report dated Jul. 17, 2017 for co-pending PCT patent application No. PCT/US17/22075.
(Continued)

*Primary Examiner* — Allison Bourke
(74) *Attorney, Agent, or Firm* — D'Ambrosio & Menon, PLLC; Usha Menon

(57) ABSTRACT

Photovoltaic systems and methods for optimizing the harvesting of solar energy are disclosed. A photovoltaic (PV) system includes: a solar panel module. The solar panel module comprises: a plurality of solar cell arrays, wherein each array comprises a grouping of solar cells; and a tubular panel. The plurality of solar cell arrays are arranged along an inside surface of the panel. At least an upper portion of the panel slopes inward such that the panel has a substantially funnel-shaped geometry. The solar cell arrays are arranged in a C-ring pattern. A first solar cell array is separated from a second solar cell array by a predetermined distance. The area between the solar cell arrays is coated with a reflective material to facilitate optimal reflection of incident sunlight back to the solar cells. Recycling of incident light is facilitated within the tube. The light can be intermittently or continuously recycled.

10 Claims, 26 Drawing Sheets

Related U.S. Application Data of application No. 15/069,591, filed on Mar. 14, 2016, which is a continuation-in-part of application No. 14/506,232, filed on Oct. 3, 2014, now Pat. No. 9,287,428, which is a continuation-in-part of application No. 29/490,051, filed on May 6, 2014, now abandoned.

(60) Provisional application No. 62/003,790, filed on May 28, 2014, provisional application No. 62/039,704, filed on Aug. 20, 2014.

(51) Int. Cl.
*H01L 31/054* (2014.01)
*F24S 23/00* (2018.01)
*H02S 10/40* (2014.01)
*H02J 50/10* (2016.01)
*B64G 1/44* (2006.01)

(52) U.S. Cl.
CPC .............. *H02S 10/12* (2014.12); *B64G 1/443* (2013.01); *H02J 50/10* (2016.02); *H02S 10/40* (2014.12); *Y02E 10/52* (2013.01)

(58) Field of Classification Search
USPC ........................................................ 136/246
See application file for complete search history.

(56) References Cited

U.S. PATENT DOCUMENTS

| | | | |
|---|---|---|---|
| 4,200,472 A | 4/1980 | Chappell et al. | |
| 4,224,082 A | 9/1980 | Jacobson | |
| 4,326,012 A * | 4/1982 | Charlton | E04C 1/392 126/698 |
| 4,361,717 A * | 11/1982 | Gilmore | F24J 2/07 136/246 |
| 4,368,415 A | 1/1983 | Henderson et al. | |
| 5,009,243 A | 4/1991 | Barker | |
| 5,501,743 A * | 3/1996 | Cherney | F24J 2/067 126/675 |
| 6,005,185 A | 12/1999 | Tange | |
| 6,224,016 B1 | 5/2001 | Lee et al. | |
| 6,369,316 B1 | 4/2002 | Plessing et al. | |
| 6,515,217 B1 | 2/2003 | Aylaian | |
| 6,586,668 B2 | 7/2003 | Shugar | |
| 6,689,949 B2 | 2/2004 | Ortabasi | |
| 7,196,292 B2 | 3/2007 | Gronet | |
| 7,259,322 B2 | 8/2007 | Gronet | |
| 7,380,549 B1 | 6/2008 | Ratliff | |
| 7,394,016 B2 | 7/2008 | Gronet | |
| 8,266,847 B2 | 9/2012 | Edgar | |
| 8,571,754 B2 | 10/2013 | Brown et al. | |
| 2002/0062856 A1* | 5/2002 | Wescott | H01L 31/0547 136/246 |
| 2004/0211458 A1 | 10/2004 | Gui | |
| 2006/0180197 A1 | 8/2006 | Gui | |
| 2006/0191566 A1* | 8/2006 | Schaafsma | F24J 2/067 136/246 |
| 2007/0169804 A1 | 7/2007 | Nakata | |
| 2008/0308151 A1 | 12/2008 | Den Boer | |
| 2009/0120486 A1 | 5/2009 | Buller | |
| 2010/0078056 A1 | 4/2010 | Hovel | |
| 2010/0242517 A1 | 9/2010 | Johnson | |
| 2010/0326493 A1 | 12/2010 | Sherman | |
| 2011/0023939 A1 | 2/2011 | Chen et al. | |
| 2011/0030766 A1 | 2/2011 | Son et al. | |
| 2011/0253200 A1 | 10/2011 | Shtein | |
| 2012/0048340 A1 | 3/2012 | Qadir | |
| 2012/0055536 A1 | 3/2012 | Saito | |
| 2012/0167492 A1 | 7/2012 | Cummings | |
| 2013/0112241 A1 | 5/2013 | Gerritsen et al. | |
| 2014/0069486 A1 | 3/2014 | Snidow | |
| 2014/0246075 A1 | 9/2014 | Goldsby | |
| 2016/0099362 A1 | 4/2016 | Bellette | |
| 2017/0025553 A1* | 1/2017 | Oh | H01L 31/0543 |

OTHER PUBLICATIONS

Written opinion and search report dated Aug. 21, 2015 for co-pending PCT patent application No. PCT/US15/32615.
USPTO Office Action dated Oct. 4, 2016 issued for related co-pending U.S. Appl. No. 15/149,506.
USPTO Office Action dated May 9, 2015 issued for parent U.S. Appl. No. 14/506,232.
USPTO Office Action dated Sep. 30, 2015 issued for parent U.S. Appl. No. 14/506,232.
USPTO NonFinal Office Action dated Aug. 12, 2016 issued for co-pending related U.S. Appl. No. 15/069,591.

\* cited by examiner

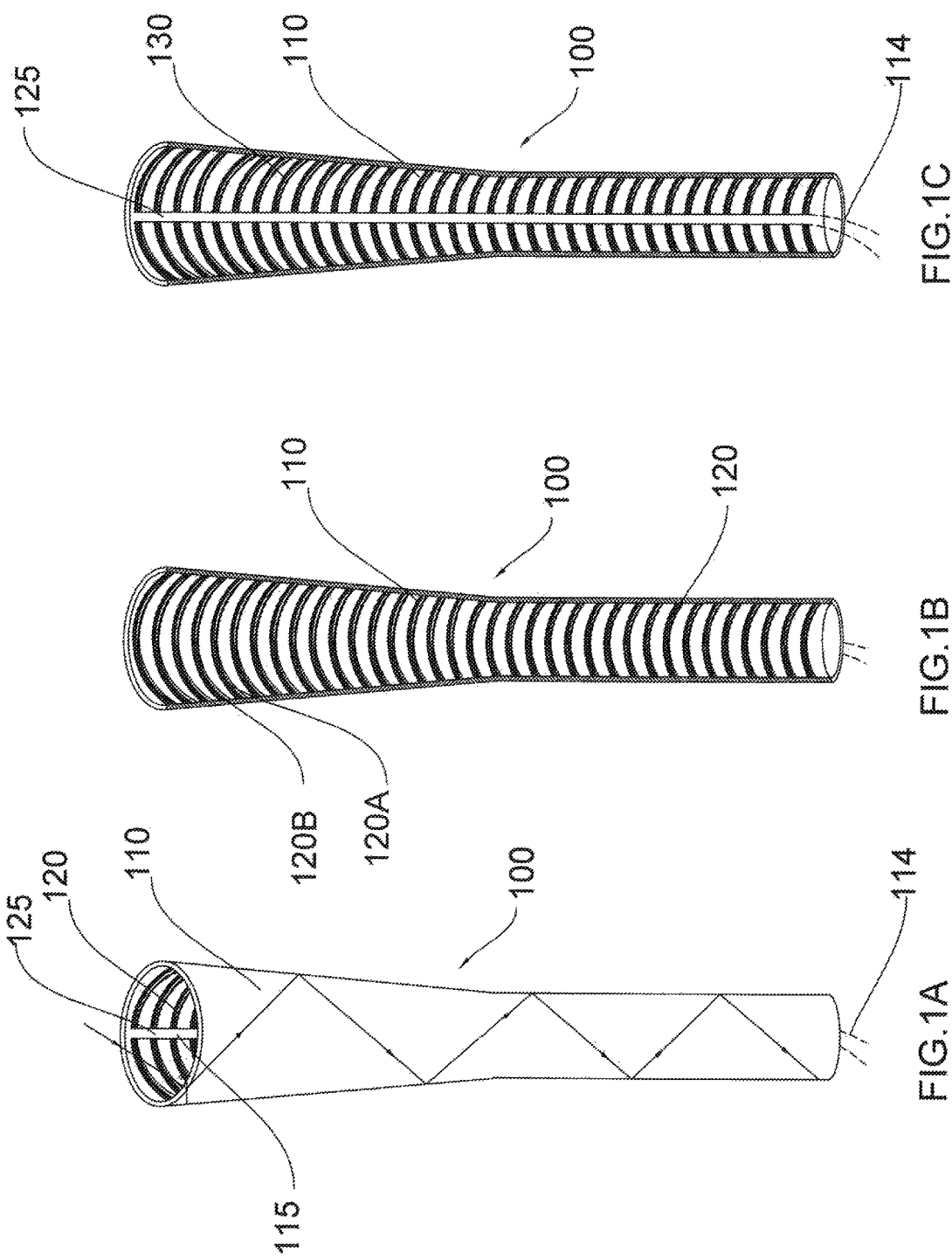

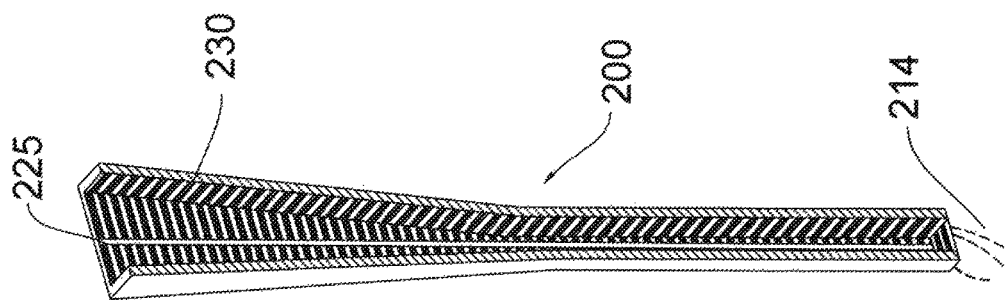
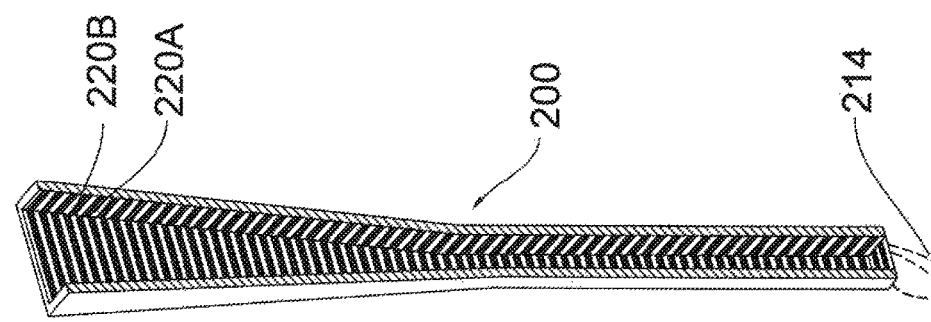
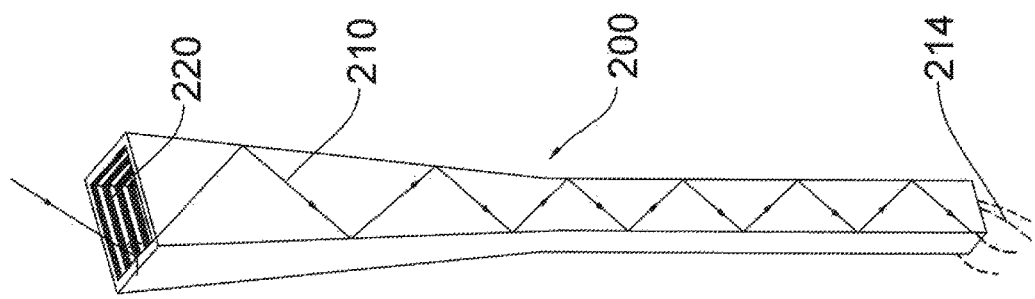

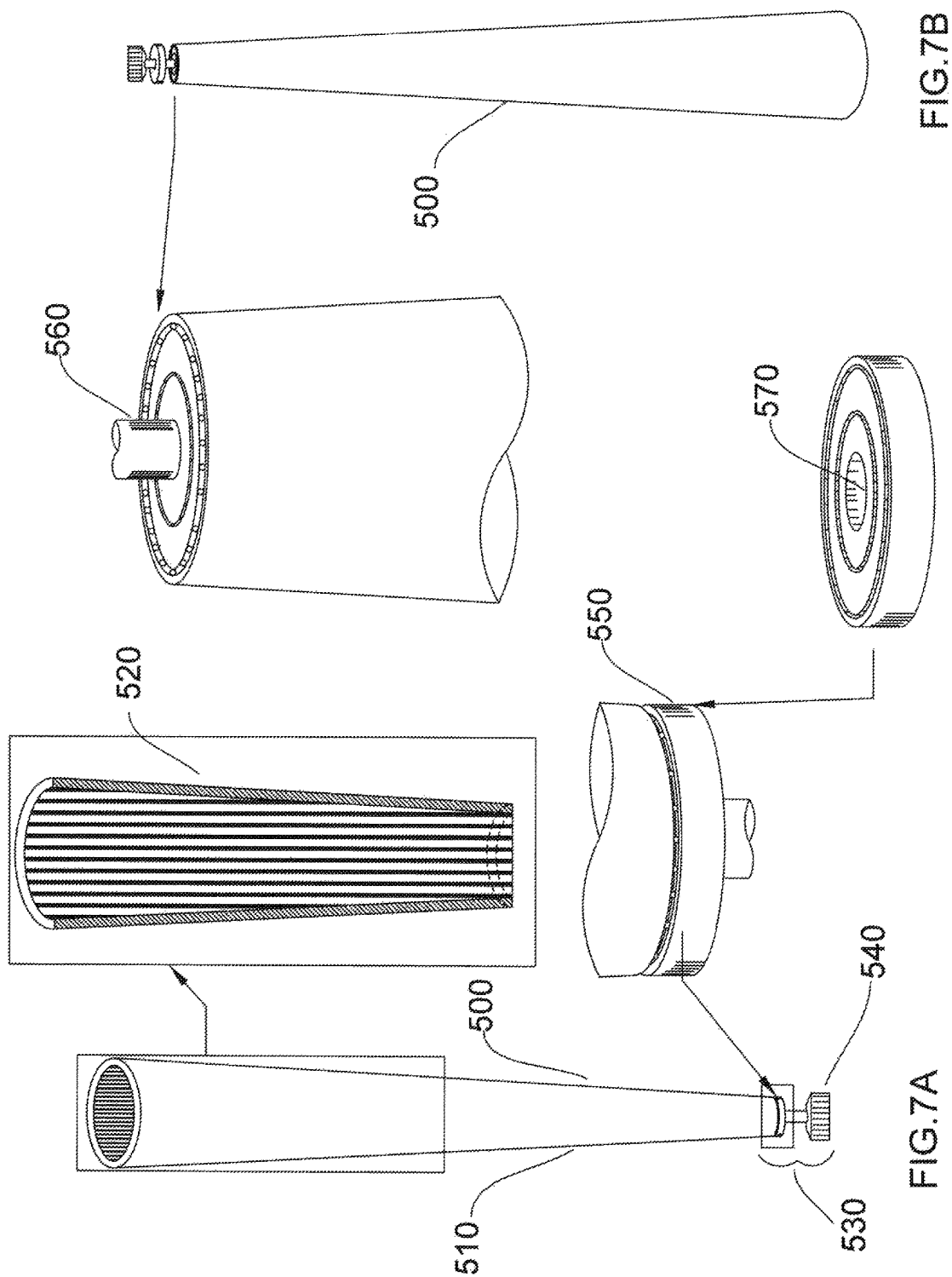

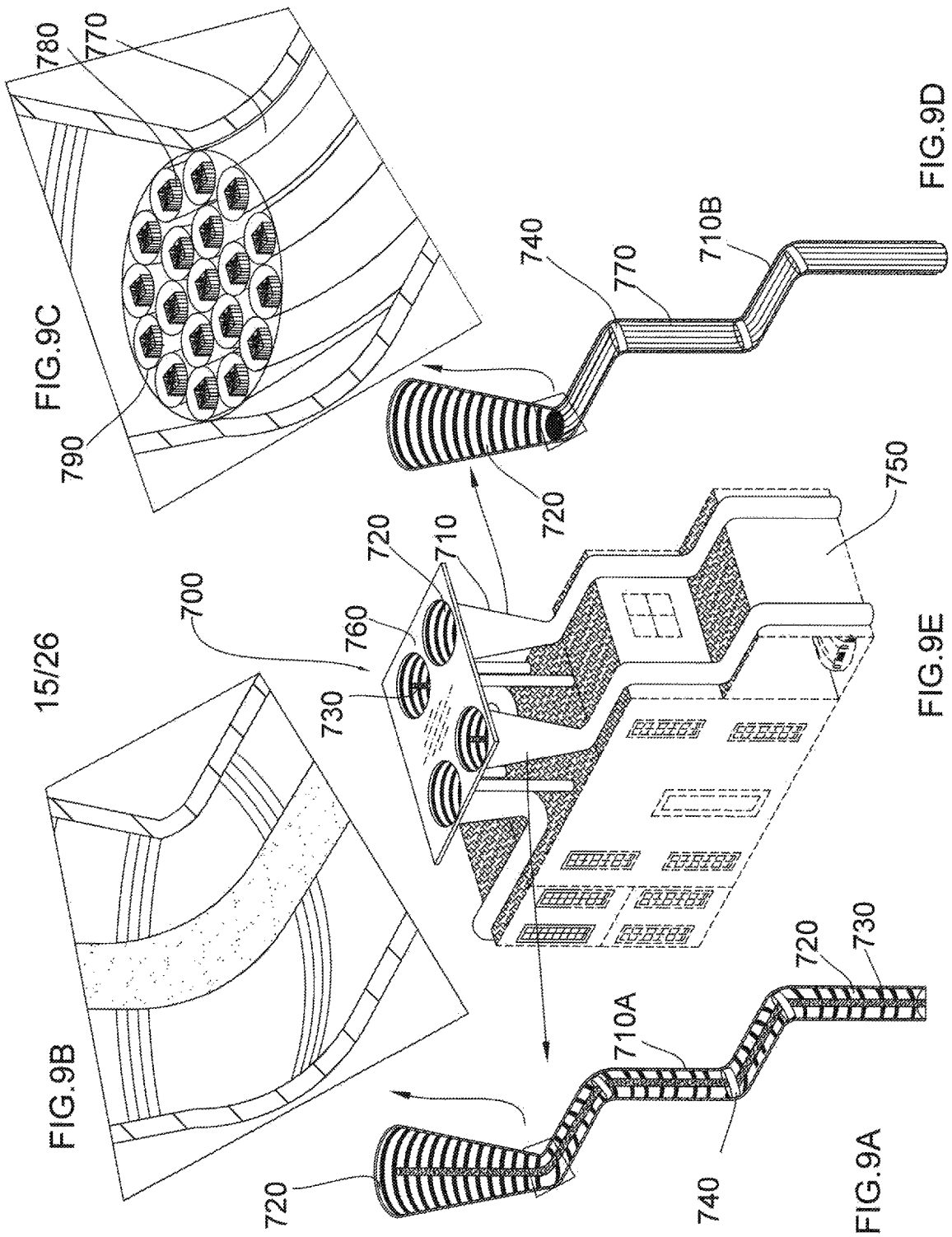

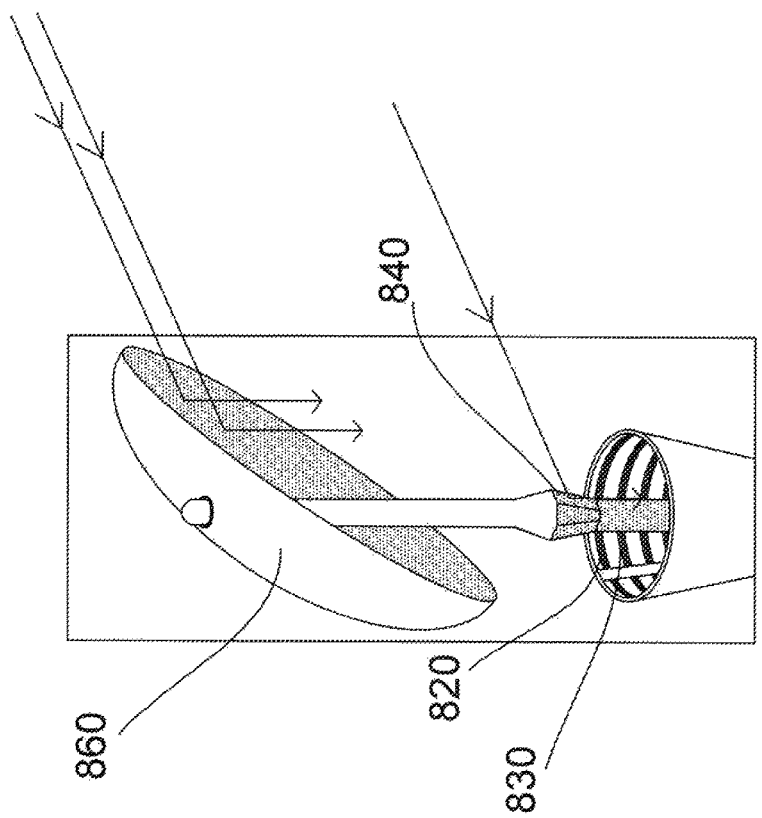
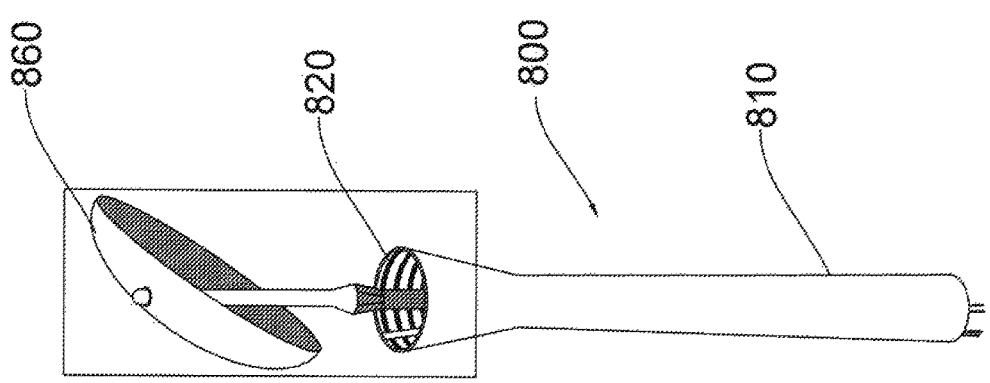

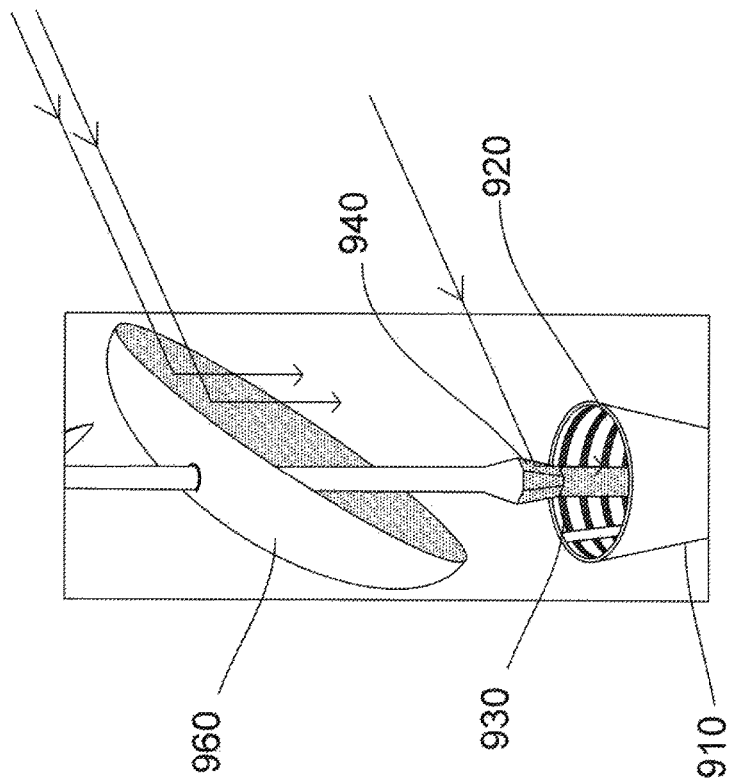
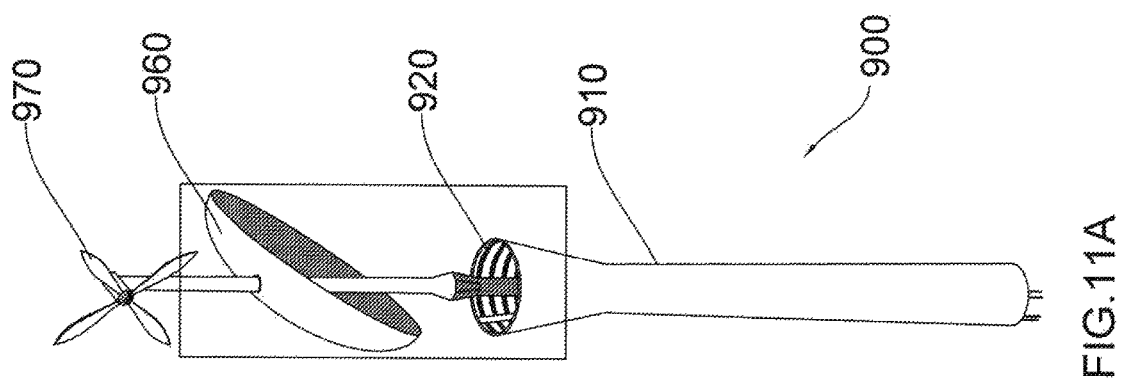
FIG.11B
FIG.11A

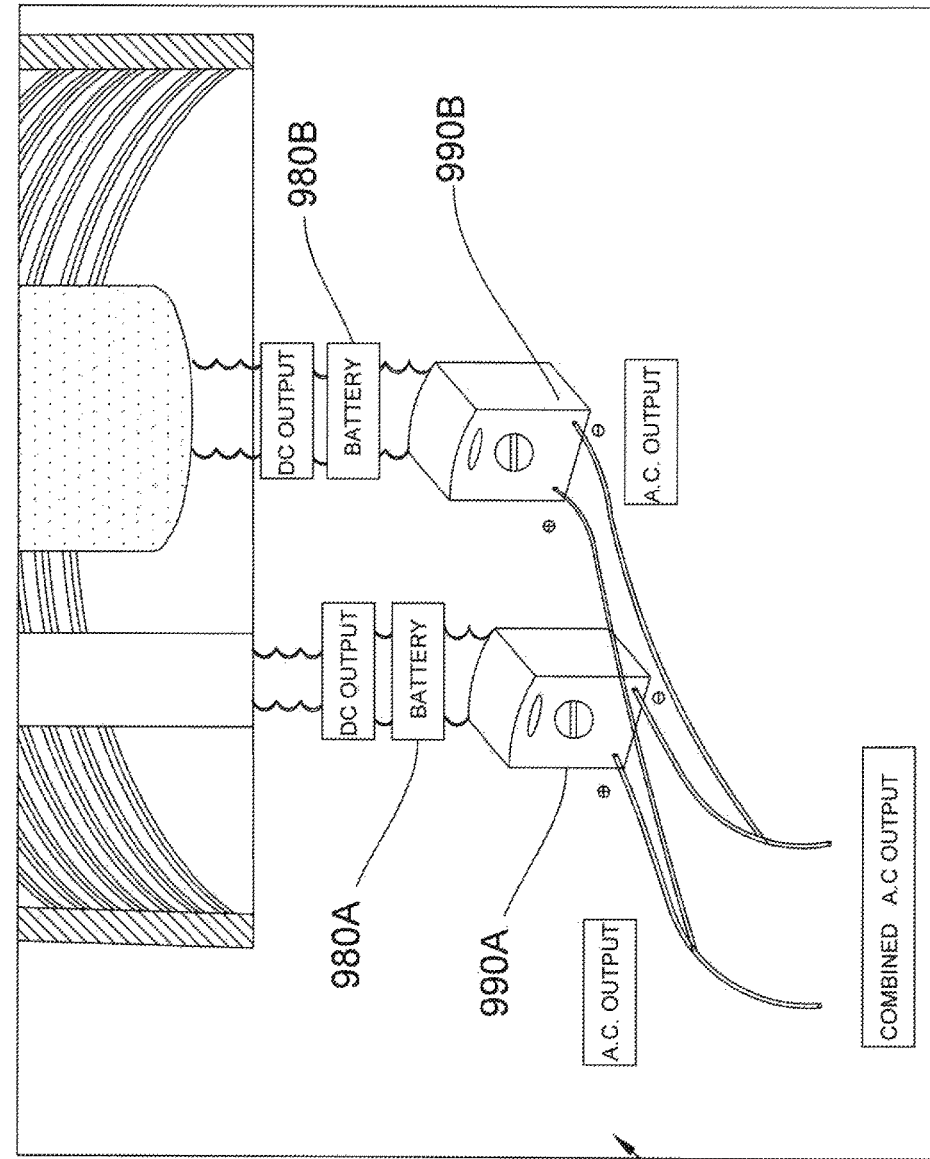
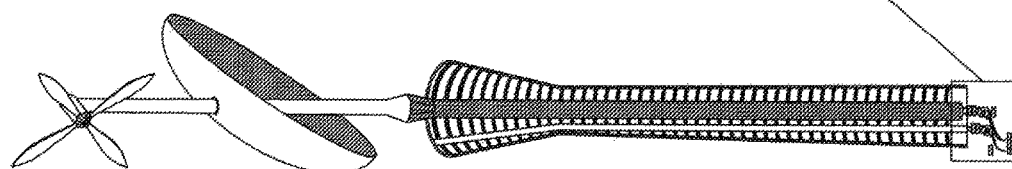
FIG. 11E

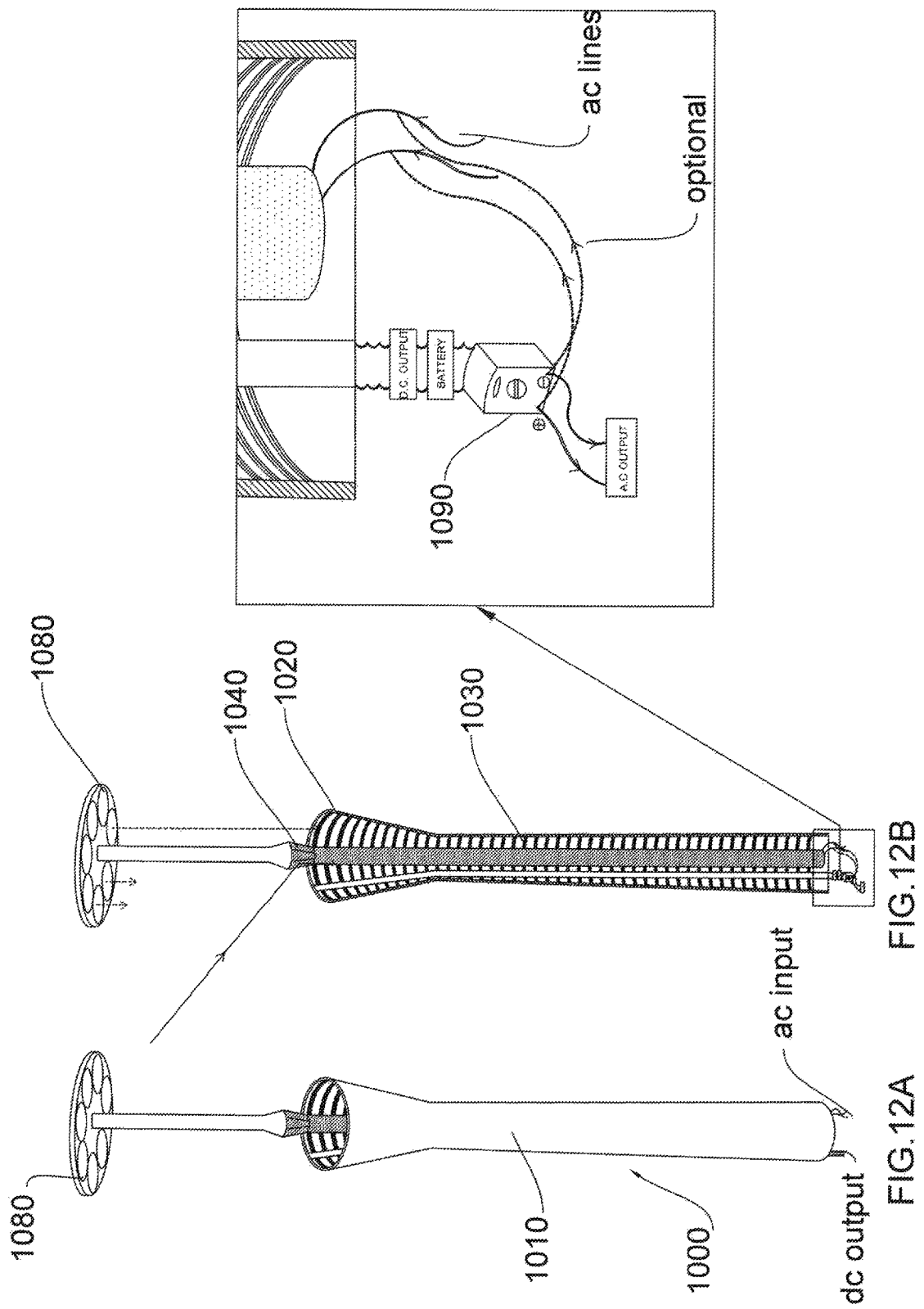

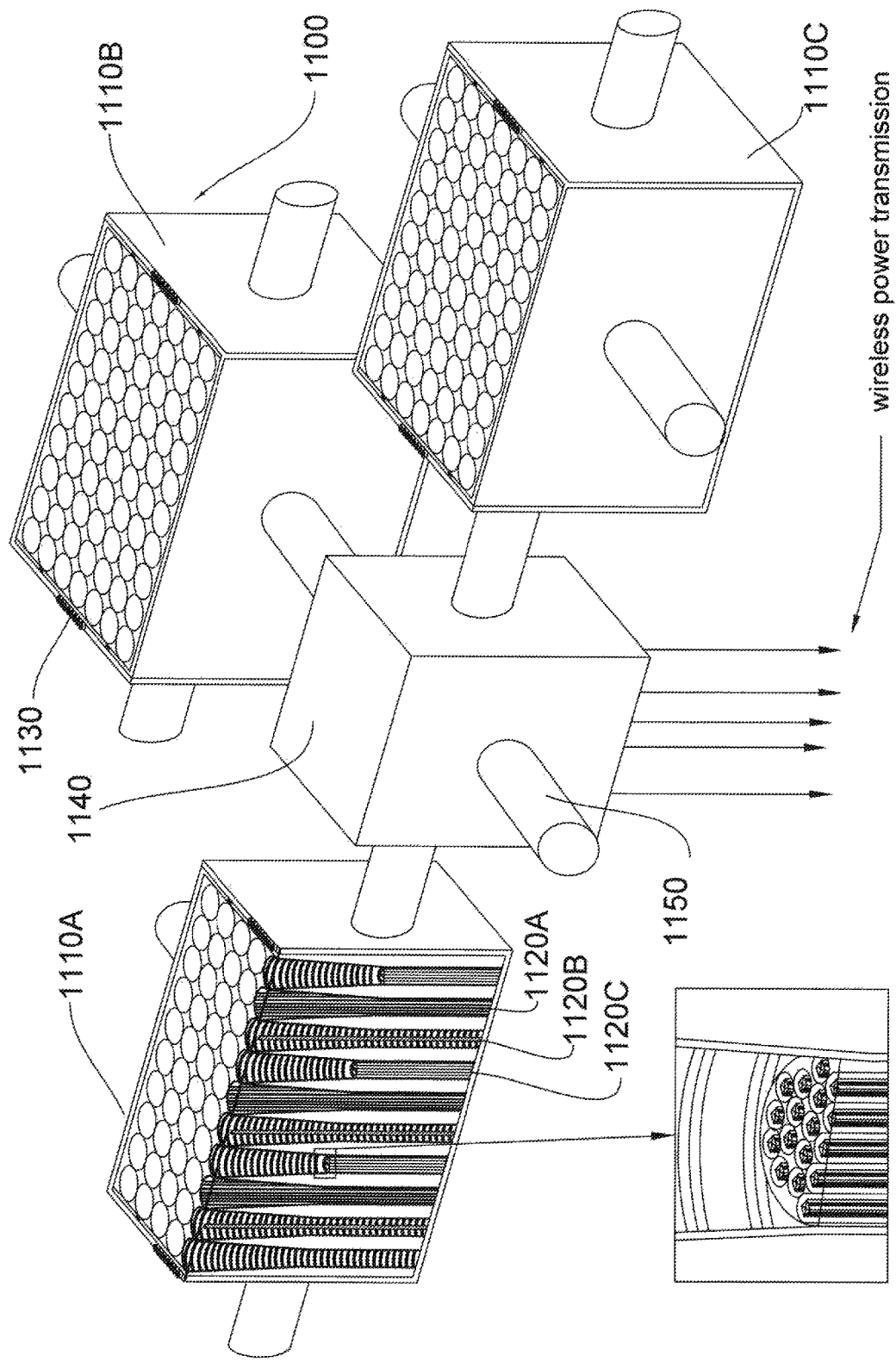

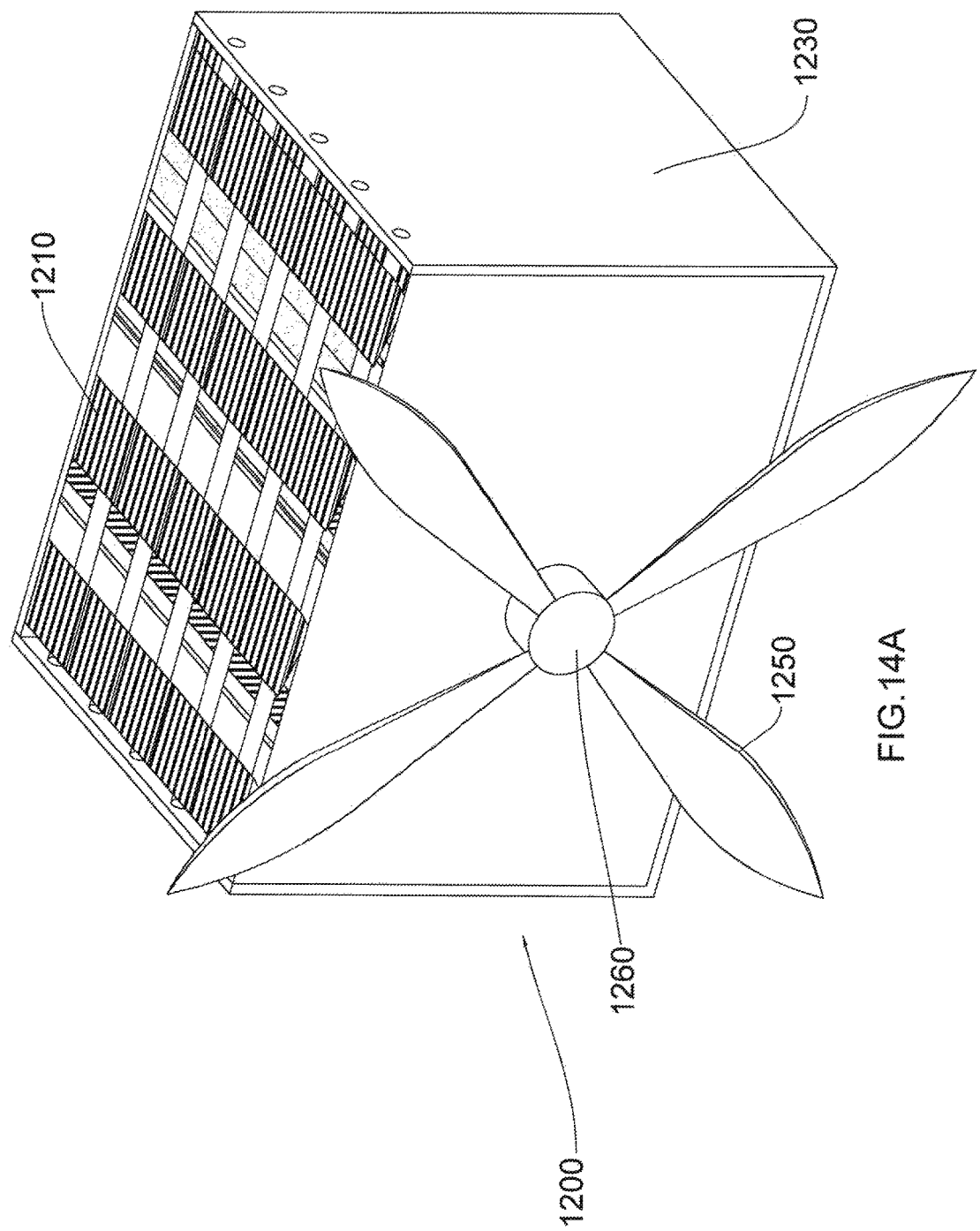

PHOTOVOLTAIC SYSTEMS WITH INTERMITTENT AND CONTINUOUS RECYCLING OF LIGHT

CROSS-REFERENCE TO RELATED APPLICATIONS

This application is a continuation-in-part of and claims priority to U.S. Ser. Nos. 15/069,591 and 15/149,506 filed on Mar. 14, 2016, and May 9, 2016, respectively and which are both continuation-in-parts of U.S. Ser. No. 14/506,232 filed Oct. 3, 2014, issued as U.S. Pat. No. 9,287,428, which is a continuation-in-part of U.S. Ser. No. 29/490,051 filed May 6, 2014, and also claims benefit of provisional patent application No. 62/003,790 filed May 28, 2014 and provisional patent application No. 62/039,704 filed Aug. 20, 2014, the contents of all of which are incorporated by reference herein.

BACKGROUND

The present invention relates generally to the field of photovoltaic systems for conversion of solar energy into electrical energy using a method of recycling of light intermittently or continuously. Use of renewable energies is increasing because of the limited supply of coal, petroleum products and other hydrocarbons. Renewable energy sources are green and environmentally friendly. Among the renewable energies, solar energy is freely and abundantly available.

Various commonly used devices are operable with solar energy. For example, solar calculators are very common. In addition to solar energy, these calculators work under any source of light energy. Similarly wrist watches are also available that work under light energy of any kind. Solar and other light energies are useful for several applications, from powering space stations to many household appliances.

Photovoltaic systems use solar radiation—both direct and scattered sunlight—to create electrical energy. The basic building blocks of a photovoltaic system are solar/photovoltaic cells. The cells typically consist of semiconductor materials that convert light into electricity. In order to increase power output, a plurality of cells can be interconnected to form panels or modules. The panels are typically flat. Several modules can be installed in a rack to form a photovoltaic array. Photovoltaic systems further include mounting racks and hardware for the panels, wiring for electrical connections, and power conditioning equipment, including inverters and optional batteries for electricity storage.

The energy conversion efficiency or ECE ($\eta$) of the cells is the percentage of the incident photon energy in the form of sunlight or any other source of light that is converted to electrical energy. When a photon penetrates a photovoltaic cell, it can produce an electron-hole pair. The pair generated may contribute to the current produced by the cell or may recombine with no net contribution to cell current.

SUMMARY

The one or more embodiments of the present invention propose a novel photovoltaic system. The one or more embodiments of the photovoltaic system create a "black body"—whereby substantially all the incident light is absorbed by the system regardless of frequency or angle of incidence. Substantially no light is reflected outside the system as in a black hole and it is forced to stay within the system where the absorbed light is then converted to solar power. According to an embodiment, a photovoltaic (PV) system includes a solar panel module. The solar panel module includes one or more tubular panels. Arranged within each tubular panel is a plurality of solar cell arrays, wherein each array comprises a grouping of solar cells. The solar cell arrays can include one or more patterns. The plurality of solar cell arrays are arranged along an inside surface of the tubular panel. At least an upper portion of the tubular panel is conical or slopes inward such that the tubular panel has a substantially funnel-shaped geometry. The tubes may or may not be provided with lids, that can filter undesirable lightwaves, provide electrochromatic layer to facilitate intermittent stimulation and/or augment the available light. In another embodiment, the tubular panel has a substantially pyramidal upper portion. The remaining portion of the tube can continue as a cylinder or as a rectangular tube. The solar cell arrays are arranged in a C-ring pattern, or vertically from the top to the bottom, or a combination of thereof. A first solar cell array is separated from a second solar cell array by a predetermined distance. The area between the solar cell arrays is coated with a suitable reflective material to facilitate optimal reflection of incident sunlight back to the solar cells. The external surface of the tube may also be coated with a suitable reflective material. Recycling of incident light is facilitated within the tube. The light can be intermittently or continuously recycled.

The tubular panels include a cavity extending through the length of the panel. The PV tubular panel further includes a core element, wherein the core element is located centrally and along the length of the cavity. The core element is coated with a reflective material, or may be made up of a single or multiple lines of solar cells, naked or enclosed in smaller microtubules. Any extension of the central core outside the solar panel may not have the reflective coating.

In one embodiment, the core element is a cylindrical member. A first or an upper portion of the core element terminates in a conical expanded member, which is also coated with reflective material. The conical expanded member facilitates redirection of light to the solar cell arrays. A second portion of the cylindrical member extends above the conical expanded member—the second portion of the cylindrical member is coupled to a concave mirror. This second portion of the cylindrical member may not have a reflective coating. In another embodiment, a wind turbine is further coupled to an extension of the central core above the concave mirror, and this second portion of the cylindrical member also may not be coated with reflective material.

The PV system includes a housing for the solar panel module. The tubular panels may be vertically arranged within the housing. The housing can include a transparent top cover plate to allow substantially all incident light to reach the solar panel module. The tubes may be arranged like towers inside the housing or the tubes may be bored into the housing with an appearance similar to a honeycomb. The top cover plate sealably encloses the solar panel module within the housing. The top cover plate includes two or more layers selected from the group consisting of: i) a filter or coating layer for allowing only optimal light bands to penetrate the housing; ii) an electrochromatic coating layer, capable of intermittently blocking the passage of light, and iii) an augmentation layer for augmenting the incident light.

In another embodiment, the PV system includes a rotator. The rotator is affixed to a base of the solar panel module.

In yet another embodiment, a photovoltaic (PV) system includes a plurality of solar panel modules, wherein each solar panel module comprises: a funnel-shaped or pyramidal panel, each panel having a plurality of solar cell arrays, wherein each array comprises a grouping of solar cells, and wherein the solar cell arrays are arranged: (A) along an inside surface of the panel, or (B) along an inside surface of the panel and in a plurality of microtubules within the panel, wherein the solar panel module is configured to bend in multiple directions and angles.

BRIEF DESCRIPTION OF THE DRAWINGS

The features and advantages of certain embodiments will be more readily appreciated when considered in conjunction with the accompanying figures. The figures are not to be construed as limiting any of the preferred embodiments.

FIGS. 1A-1C illustrate various views of a solar panel module according to certain embodiments.

FIGS. 3A-3C illustrate various views of a solar panel module according to certain embodiments.

FIGS. 7A-7B illustrate a solar panel module having a rotator according to certain embodiments.

FIGS. 9A-9D illustrate various views of a solar panel module according to certain other embodiments.

FIG. 9E illustrates a photovoltaic system on a dwelling according an embodiment.

FIGS. 10A-10B illustrate various views of a photovoltaic system according to certain embodiments.

FIGS. 11A-11E illustrate various views of hybrid photovoltaic and wind energy conversion system according to certain embodiments.

FIGS. 12A-12B illustrate various views of a combination photovoltaic system and a street lighting system according to certain embodiments.

FIGS. 13A-13B illustrate various views of a space based solar power system according to certain embodiments.

FIGS. 14A-14D illustrate various views of a hybrid photovoltaic system and a wind energy conversion system according to certain embodiments.

DETAILED DESCRIPTION OF THE INVENTION

Figure 2B:
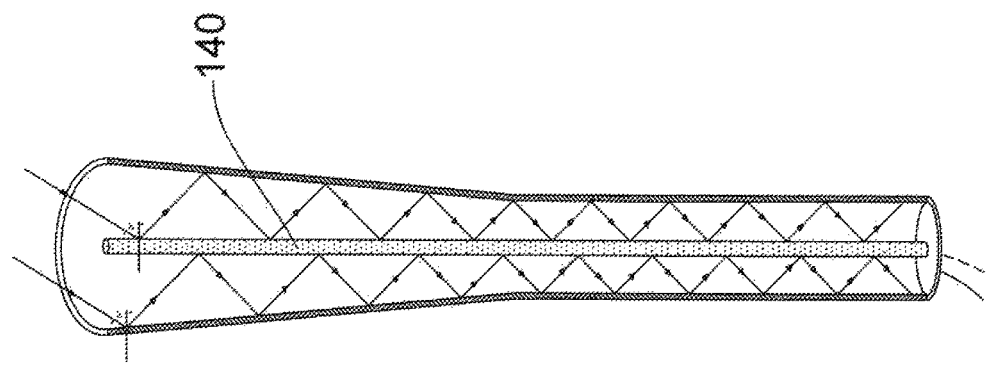
FIGS. 2A-2E illustrate various views of the solar panel module shown in FIGS. 1A-1C having a central core according to certain other embodiments.

The following description presents several preferred embodiments of the present invention in sufficient detail such that those skilled in the art can make and use the invention. As used herein, the words "comprise," "have," "include," and all grammatical variations thereof are each intended to have an open, non-limiting meaning that does not exclude additional elements or steps. As used herein, a "fluid" can be a liquid or gas. For example, the fluid may be water, air, or gas.

Our ability to harvest solar energy continues to be inefficient. The amount of power generated by a photovoltaic (PV) system can depend on: (a) the amount of the sunlight that reaches the system, and (b) how the available light is utilized. Most solar panels cannot capture and utilize optimal light for various reasons. For solar applications, this limitation reduces the utility of the PV system significantly especially in non-tropical regions of the world. The area required for the PV system to generate even modest amount of energy is very large and this limits its utility. Furthermore, conventional present solar panels are continuously bombarded by the solar radiation. It is further hypothesized that the solar cells may function sub-optimally when they are constantly stimulated without intervening rest periods. In a typical solar panel there is about 50-80% of the total light reflected back into the atmosphere from the outer surface of the panel. The infrared and ultraviolet rays are wasted by producing undesirable heat when the intended use is to produce electricity. Another portion of the light passes through the panel without doing anything. All these wasted elements amount to over 80% of the available light. In addition, there is inherent system inefficiency, due to the single pass of light through the semiconductor, reducing its total energy conversion rate to about 17 to 18% efficiency. Yet another serious problem with the present solar panels may be the factor of continuous stimulation paralyzing the solar cells and reducing its efficiency. Preliminary testing by the inventor has shown that continuous stimulation can reduce power output over time by around 30%-40%. Only part of this reduction can be explained by the elevated temperature in the solar panel. The benefit of intermittent stimulation is an area not considered so far and has the potential to make significant contribution to the harvesting of solar energy. Considerable research and development has been devoted to improving the various parts of a photovoltaic system to improve generation of electricity. Much of the research has been focused on improvements in solar cells and in improving the energy conversion efficiency of solar cells. Research has also been focused on concentrators in which light is focused by lenses or mirrors onto an array of solar cells. While the demand for solar and photovoltaic technology continues to grow worldwide, widespread use is inhibited by associated costs.

U.S. Pat. No. 4,080,221 describe a method for redirecting light source to the bottom of conical units. In reality this does not add to the ultimate energy output because what was gained by the light redirection was at the cost of losing significant surface area for the solar cells. Depending upon the angle of the slope there is proportionate loss of surface area for the solar cells and it also causes portion of the light being reflected back into the atmosphere. U.S. Pat. Pub. No. 20160099362 discloses a method of containing conventional solar panels inside large cylindrical enclosures so that the panels are protected from outside contamination. These panels can also be removed from the cylinders for purpose of cleaning. Individual panels behave like conventional, flat panels except that they are kept vertical along the walls of the cylindrical enclosures. There are reflecting mirrors between the panels but they rarely can redirect light on to other panels because of the distance from the mirrors to the panels on the opposite wall unless the light rays are directed acutely on to the mirrors. Being inside the cylindrical containers, sun-rays can rarely reach the mirrors at such acute angle even during sunrise and sunset. Light recycling is impossible for these reasons. However, neither of these disclosures facilitate continuous or intermittent light recycling.

FIG. 1A illustrates an embodiment of a solar panel module 100. FIGS. 1B and 1C illustrate a longitudinal sectional views of the front and back thereof respectively. Now referring to FIGS. 1A-1C, the solar panel module 100 includes an array of photovoltaic or solar cells 120 and a tubular panel 110 for receiving the solar cell array. The panel 110 comprises an elongated tube having a central cavity 115. In certain embodiments, at least a top or an inlet portion of the tube 110 may be sloped inward such that the panel has a substantially funnel-shaped geometry. The tube 110 facilitates collection of light rays.

A plurality of solar cell arrays 120 are arranged in depth along the inside wall of the tube 110 resulting in a in three-dimensional and not in flat, two-dimensional layers. Thus, the solar cell arrays 120 can have a three-dimensional arrangement within the tubes 110 with reference to the top surface of a housing (as shown in FIGS. 5A-6C). The solar cell arrays 120 may be arranged in a substantially incomplete concentric rings or in a C-ring pattern. A first solar cell array 120A may be separated from a second solar cell array 120B by a predetermined distance "d". A vertical gap 125 may be formed within each of the solar cell arrays. Electrical connections 114 may pass through the gap 125 to harness the power produced by the solar cells. The solar cell array 120 includes a plurality of interconnected solar cells. Solar cells are known in the art. The solar cells and the the solar cell arrays 120 are electrically interconnected. The solar cell arrays 120 can be connected in series, in parallel or in any combinations thereof. The conducting wires that take the current off the solar panel module 100 may contain silver, copper or other non-magnetic conductive metals.

Area 130 between each of the rings may be lined or coated with a reflective material to enhance and facilitate optimal reflection of incident light back to the solar cells. The reflective material may be selected from any material known in the art. Additionally, the tube 110 and the cavity 115 can be filled with a transparent material such as glass or plastic (not shown). The solar cells can also be arranged vertically as in 7C or in any combination thereof.

As can be seen in FIG. 1A, sunlight (or light from any other source) can enter from the top of the tube 110. The arrows depict the path of the light within the tube 110. Due to the reflective coating between each of the rings, light is forced to scatter back onto the cells inside the tube 110 thereby facilitating multiple passes of the incident light.

As shown in FIGS. 2A-2E, in one embodiment, the tube 110 may include the solar cell arrays 120 and at least one core element 140, 150, 160. (Although present, the solar cell array 120 is omitted from FIGS. 2B, 2D and 2E in order to show the path of the light rays). The tube 110 may comprise carbon nanotubes, aluminum, fiber glass tubes, etc. The tube 110 is configured to facilitate total internal reflection from the inside surfaces and also from a deep end of each tube with or without a central core. In one or more embodiments, the one or more core elements 140, 150, 160 may be positioned centrally within the cavity of the tube 110.

Figure 2A:
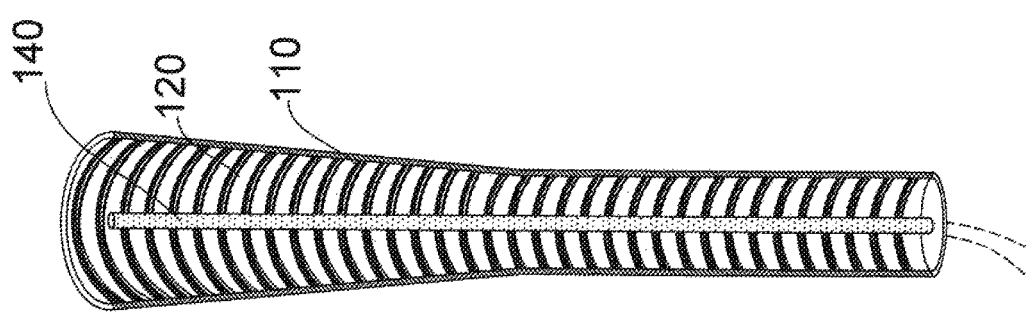

As shown in FIGS. 2A and 2B, the core element 140 comprises a solid cylindrical shaft. The cylindrical shaft 140 may be plain or corrugated. The cylindrical shaft 140 may be lined or coated with a reflective material known in the art. Central core may also be made of a single or multiple lines of solar cells, either naked or enclosed in much smaller microtubules (not shown) with reflective surfaces inside and outside such tubules.

Figure 2E:
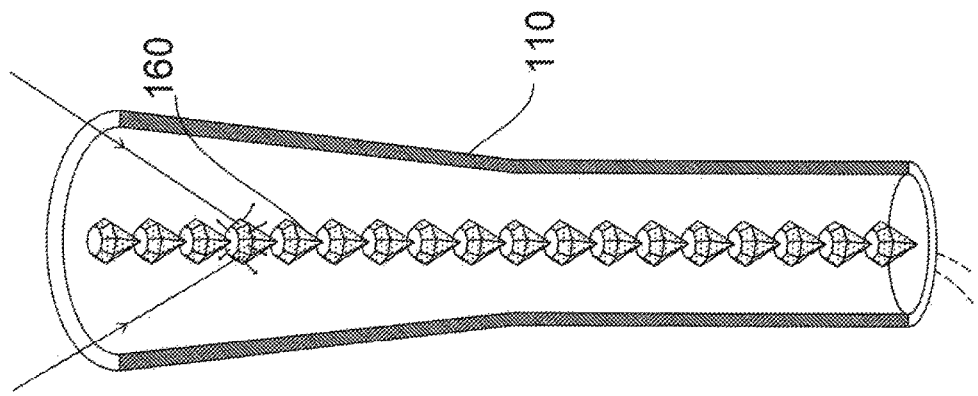
Figure 2D:
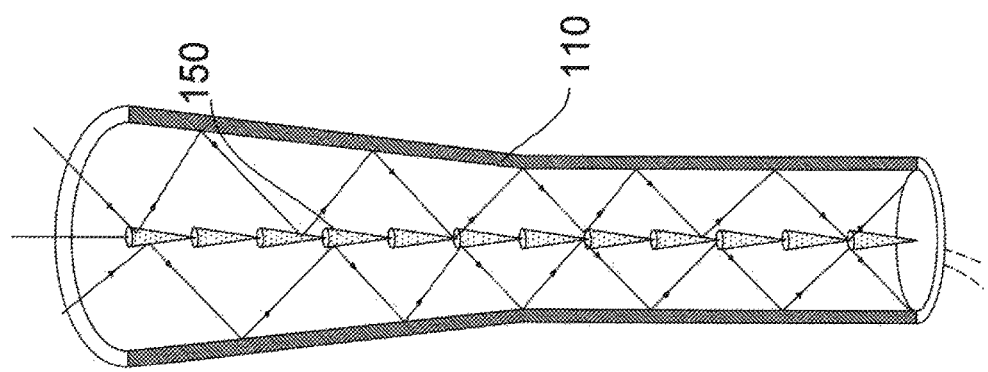
Figure 2C:
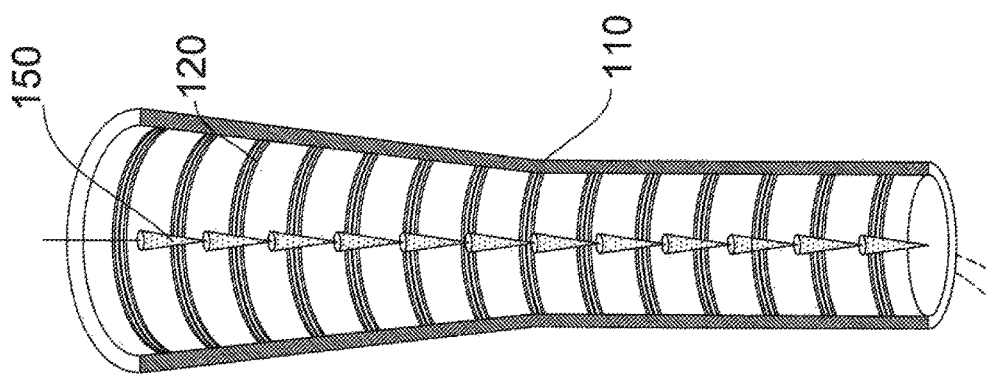

As shown in FIGS. 2C and 2D, the core element 150 comprises a plurality of inverted conical elements. Each conical element 150 is coated with a reflective material. The conical elements 150 may be stacked within the tube 110. Each conical element 150 may be coupled to or abutting at least one other conical element.

As shown in FIG. 2E, the core element 160 comprises a plurality of multifaceted elements to optimize dispersion of light, for light recyclying inside the tube 110. The multifaceted elements 160 are substantially in the form of a diamond in order to facilitate light dispersion and recycling. In one or more embodiments, as shown in FIGS. 2C and 2D, the tube 110 may have a wider slope, in comparison to the tube shown in FIGS. 2A-2B.

As shown in FIGS. 2B and 2D, the core elements 140, 150 may further facilitate light scattering and recycling. This will also help a rather uniform distribution of light onto the solar cells in the solar cell array irrespective of the angle in which the light enters the tube 110. Multifaceted elements 160, as shown in FIG. 2E, can disperse light in all directions inside the tube and facilitate further light recycling. The length of the tube 110 may be determined by the available space and the intensity of the light.

FIG. 3A depicts another embodiment of the solar panel module. FIGS. 3B and 3C illustrate a longitudinal sectional views of the front and back thereof respectively. As shown, the solar panel module 200 includes a pyramidal upper portion of the tube 210 for receiving the solar cell arrays 220 and may continue as a rectangular or square shaped tube. At least a top or inlet portion of tube 210 slopes inward. The tube 210 has a generally square or rectangular cross-section along the length of the tube. The tube 210 may comprise carbon nanotubes, aluminum, fiber glass tubes, etc. The tubes 210 are configured to facilitate total internal reflection from the inside surfaces and also from a deep end of each tube. Solar cells are known in the art.

A plurality of solar cell arrays 220 are arranged in depth along the inside wall of the tube 210 and in three-dimensional and not in flat, two-dimensional layers. Thus, the solar cell arrays 220 can have a three-dimensional arrangement within the tubes 210 with reference to the top surface of a housing (as shown in FIGS. 5A-6C). The solar cell arrays 220 may be arranged in a substantially incomplete rectangular pattern. A first solar cell array 220A may be separated from a second solar cell array 220B by a predetermined distance "d". A vertical gap 225 may be formed within each of the solar cell arrays. Electrical connections 214 may pass through the gap 225 to harness the power produced by the solar cell arrays 220. The solar cells and the solar cell arrays 220 are electrically interconnected. The solar cell arrays 220 can be connected in series, in parallel or in any combinations thereof. The conducting wires that take the current off the solar panel module 200 may contain silver, copper or other non-magnetic conductive metals. The area 230 between each of the arrays may be lined or coated with a reflective material to facilitate optimal reflection of incident light back to the solar cells. Additionally, the tube 210 and the cavity 215 can be filled with a transparent material such as glass or plastic (not shown). In other embodiments, a single string of solar cells may be used as a central core (not shown), and the entire inside wall of the tube may be lined with a reflective material.

Figure 4B:
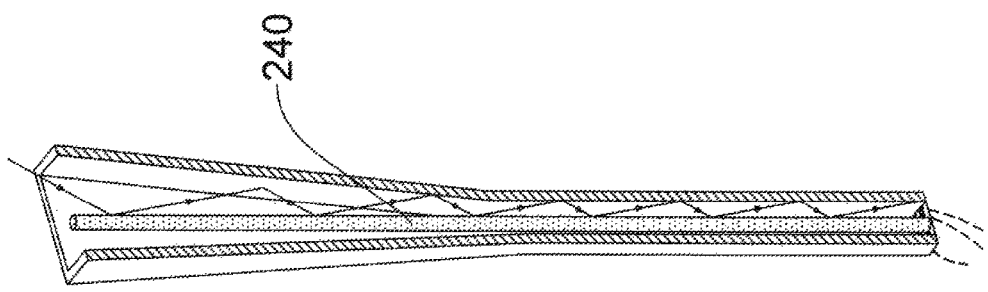
FIGS. 4A-4E illustrate various views of the solar panel module shown in FIGS. 1A-1C having a central core according to certain other embodiments.
Figure 4A:
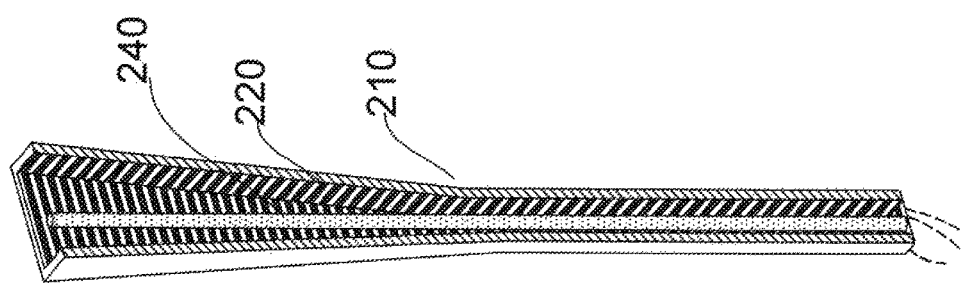
Figure 4E:
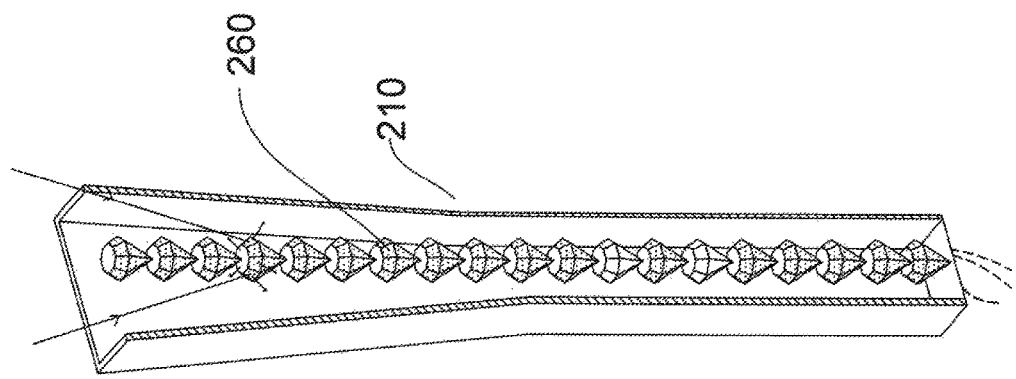
Figure 4D:
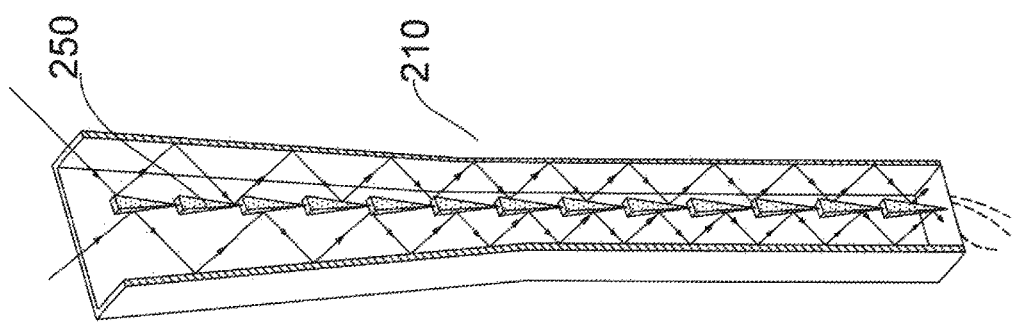
Figure 4C:
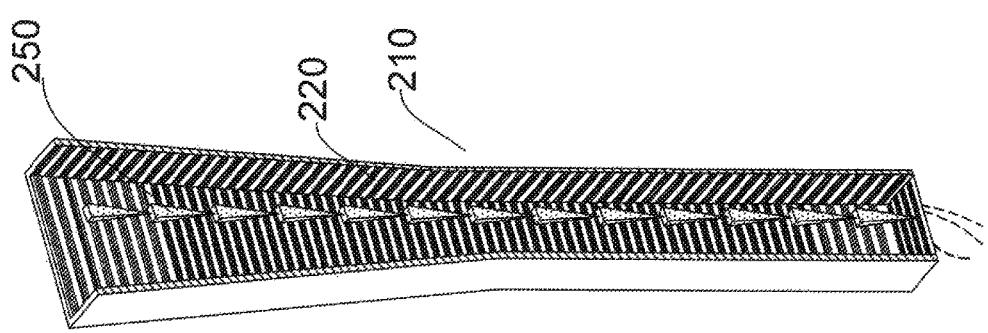

In one or more embodiments, one or more core elements 240, 250, 260 may be positioned centrally within the cavity 215 of each tube 210. For example, as shown in FIGS. 4A and 4B, a core element comprises a solid cylindrical shaft 240. Alternately, the shaft may be cubical, four-sided or multi-sided (as shown in FIG. 5C with core 240A). The shaft 240 may be plain or corrugated. The shaft 240 may be lined or coated with a reflective material known in the art. (The central core may also be made of a single or multiple lines of solar cells, either naked or enclosed in much smaller microtubules (as shown in FIG. 9D) with reflective surfaces inside and outside such tubules). In yet another embodiment, as shown in FIGS. 4C and 4D, the core element comprises a plurality of inverted pyramidal reflective elements 250 stacked within the tube 210. Each pyramidal reflective element 250 may be coupled to or abutting at least one other reflective element. The reflective element 250 may be lined or coated with a reflective material known in the art. In yet another embodiment, as shown in FIG. 4E, the core element comprises a plurality of multifaceted, diamond-shaped, elements 260. These multifaceted elements 260 are configured to optimize dispersion of light and recycling inside the module.

As can be seen in FIG. 3A, sunlight (or light from any other source) can enter from the top of the tube 210. The arrows depict the path of the light within the tube 210. Due to the reflective coating between each of the rings, light is forced to scatter back onto the cells inside the tube 210 thereby facilitating multiple passes of the incident light. As shown in FIGS. 3A, 4B and 4D, the cores 240, 250 may further facilitate light scattering and recycling. This will also help a rather uniform distribution of light onto the solar cells irrespective of the angle in which the light enters the tube 210. Multifaceted elements 260, shown in FIG. 4E, can further disperse light in all directions inside the tube and facilitate light recycling. The length of the tube 210 may be determined by the available space and the intensity of the light.

The slope of the tubes 110 and 210 with the special arrangement of the solar cell arrays 120, 220 within the tubes creates a three dimensional solar panel modules. Due to the depth and inward slope of the tube 110, 220 incident light is completely utilized within the solar module 100, 200 and there is substantially no dissipation of light back to the atmosphere.

Thus, the various embodiments of the solar panel module 100, 200 optimize the harvesting of light by reducing the amount of wasted light due to refraction and reflection and by increasing the total internal reflection. Additionally, the total length of the tube 110, 210 and number of solar panel arrays 120, 220 contained within the tube 110, 210 can vary in order to accommodate the intensity of light at a particular location and the availability of space. For example, if the intensity of the light is low, the length of the tube 110, 210 and the number of cell arrays 120, 220 can be increased to optimize harvesting of the light, or, the length may be increased in areas of intense light source to harvest more energy per unit area.

In another embodiment, a method for providing space based solar power is disclosed. Space based solar power is the concept of collecting power in outer space or space and storing that in special units and transferring that energy to Earth using wireless energy transmission techniques. The method involves providing a space based solar power system comprising one or more solar panel modules disclosed in FIGS. 1A-4E. An exemplary space based solar power system is disclosed in FIGS. 13A-13B. As shown, the space based solar power system 1100 includes housing for a plurality of solar panel modules 1110A, 1110B, 1110C (collectively "housing 1110"). Each housing may include sun sensors 1130, to facilitate maximum light entering the solar panel modules 1120A, 1120B, 1120C. The solar panel modules include tubular panels having varying geometries (as discussed previously) and each panel can have varying arrangements of solar cells therein. The housing 1110 can be operably connected to an energy storage unit 1140 by a docking arm or connector 1150. The method further involves providing the space based solar power system with docking arms to connect to additional solar panel housing as and when the need arises at the receiving facilities on the ground. The space based solar power system 1100 can reside on a satellite that orbits the Earth or it can be stationary and positioned in strategic places in space. The method involves using the space based solar power system to convert sunlight to energy that can be stored in the energy storage unit 1140. The method further involves transferring the energy thus created in space down to receiving units on the ground using wireless power transmission. Various ways of wireless transfer of electricity from point A to point B have already been shown to be a possibility utilizing radio waves, microwaves, laser, or other technologies. Electric toothbrush and rechargeable batteries implanted for human use are some examples of wireless transfer of energy that are currently available. Long distance wireless transfer of energy is still in the research phase. By placing such receiving ground units on hilltops or other uninhibited areas, interference with TV, cell phones, and other devices can be avoided.

The method further involves transferring the electricity created by the strategically placed space based solar power system 1200 to moving units like private vehicles, planes, drones and public transportation systems on the ground or in the sky. By using this method for providing continuous energy supply from one satellite or another to recharge the moving units, the range of electric cars and other vehicles can be made longer and even infinite. This method can facilitate eco-friendly transportation using the space based solar power system. The method may further involve provided each moving vehicle with a coded receiver (not shown), which can switch from a first space based solar power system 1200 on a first satellite to a second space based solar power system on a second satellite depending on the satellite's proximity to the vehicle. Coded receivers are known in the art. The coded receiver can also be metered to measure the electricity utilization. The electricity thus received by the moving vehicles can be used to charge the batteries in vehicle that run it.

Figure 5A:
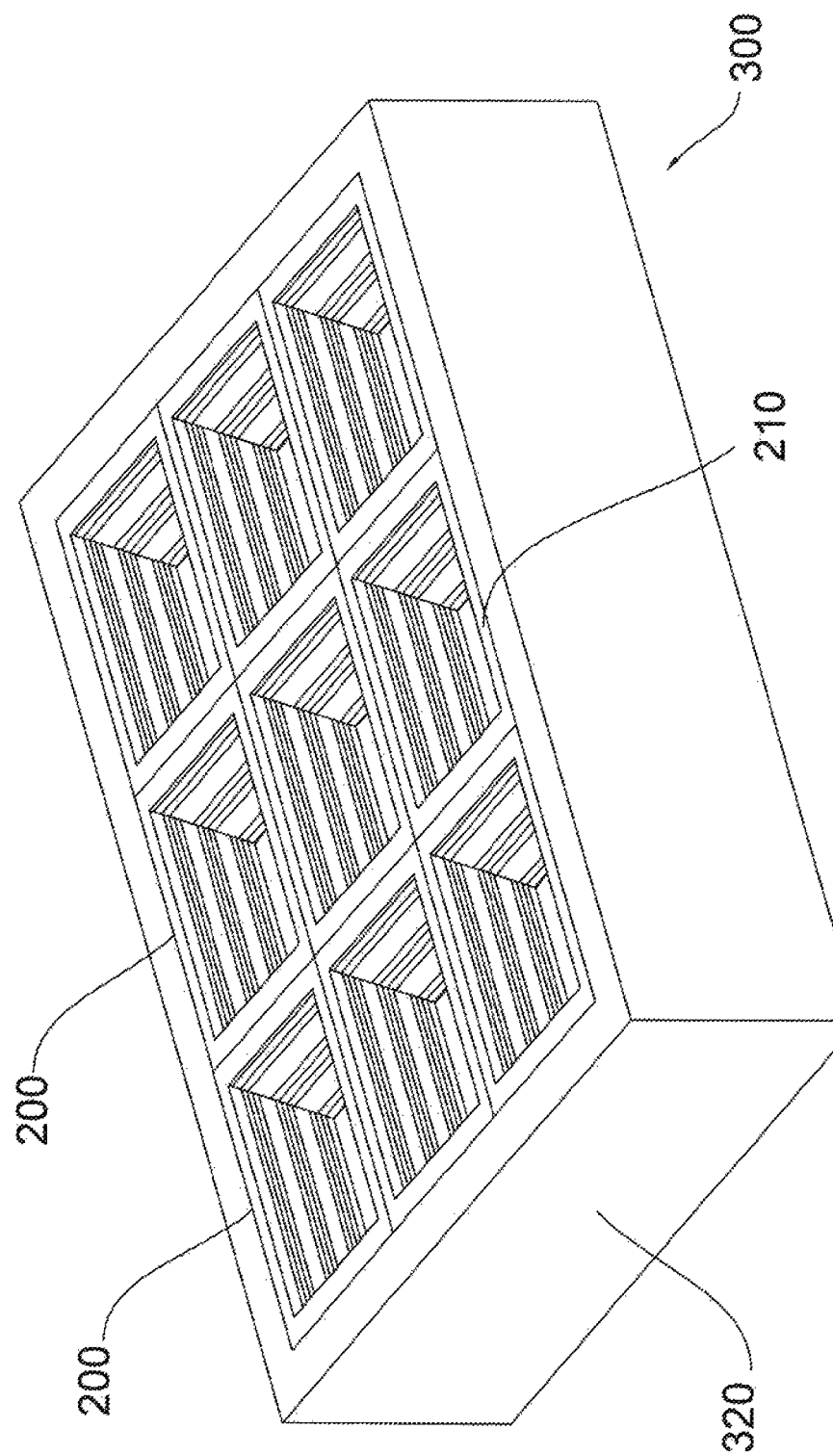
FIGS. 5A-5C illustrate a photovoltaic system according to certain embodiments
Figure 5B:
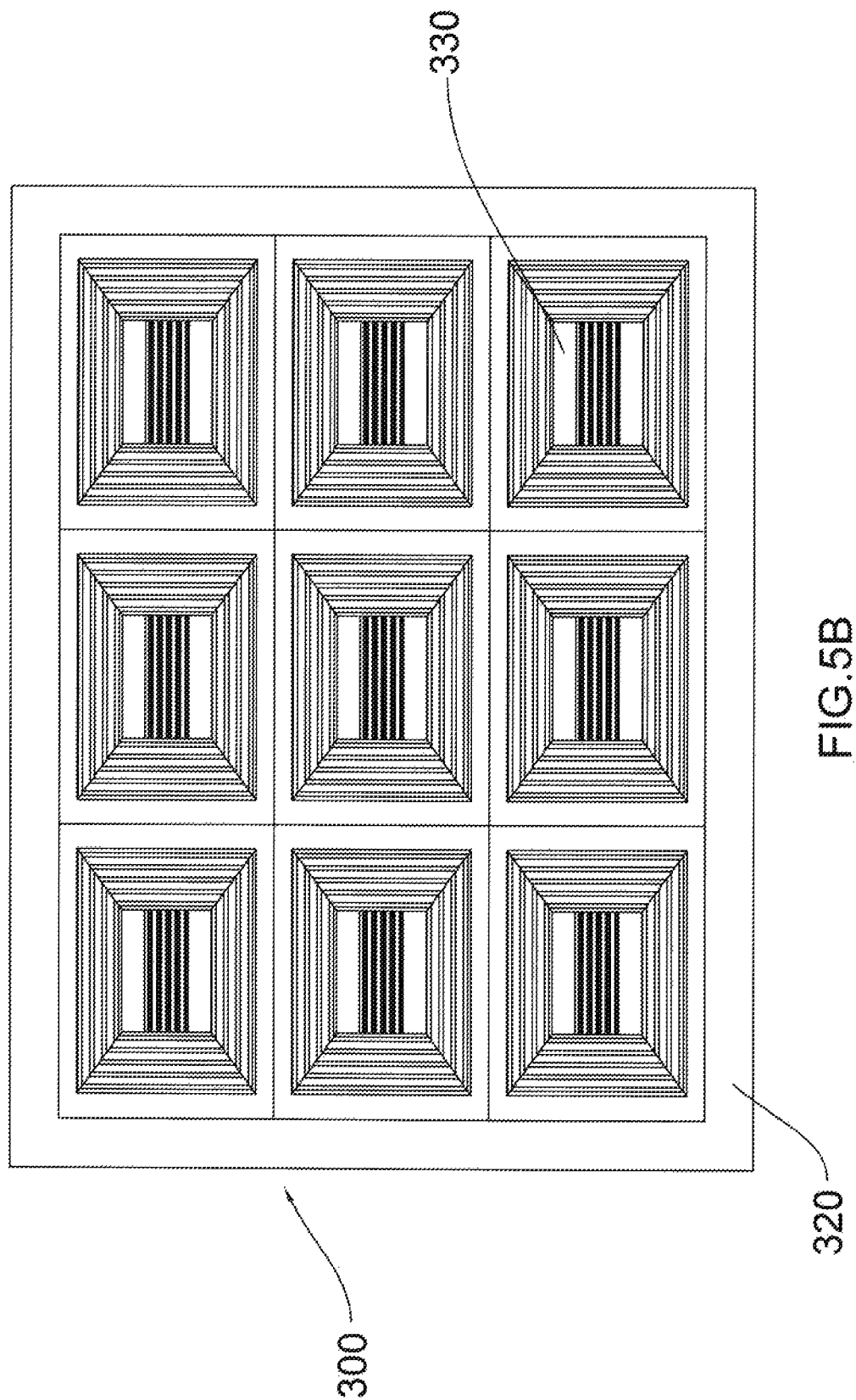
Figure 5C:
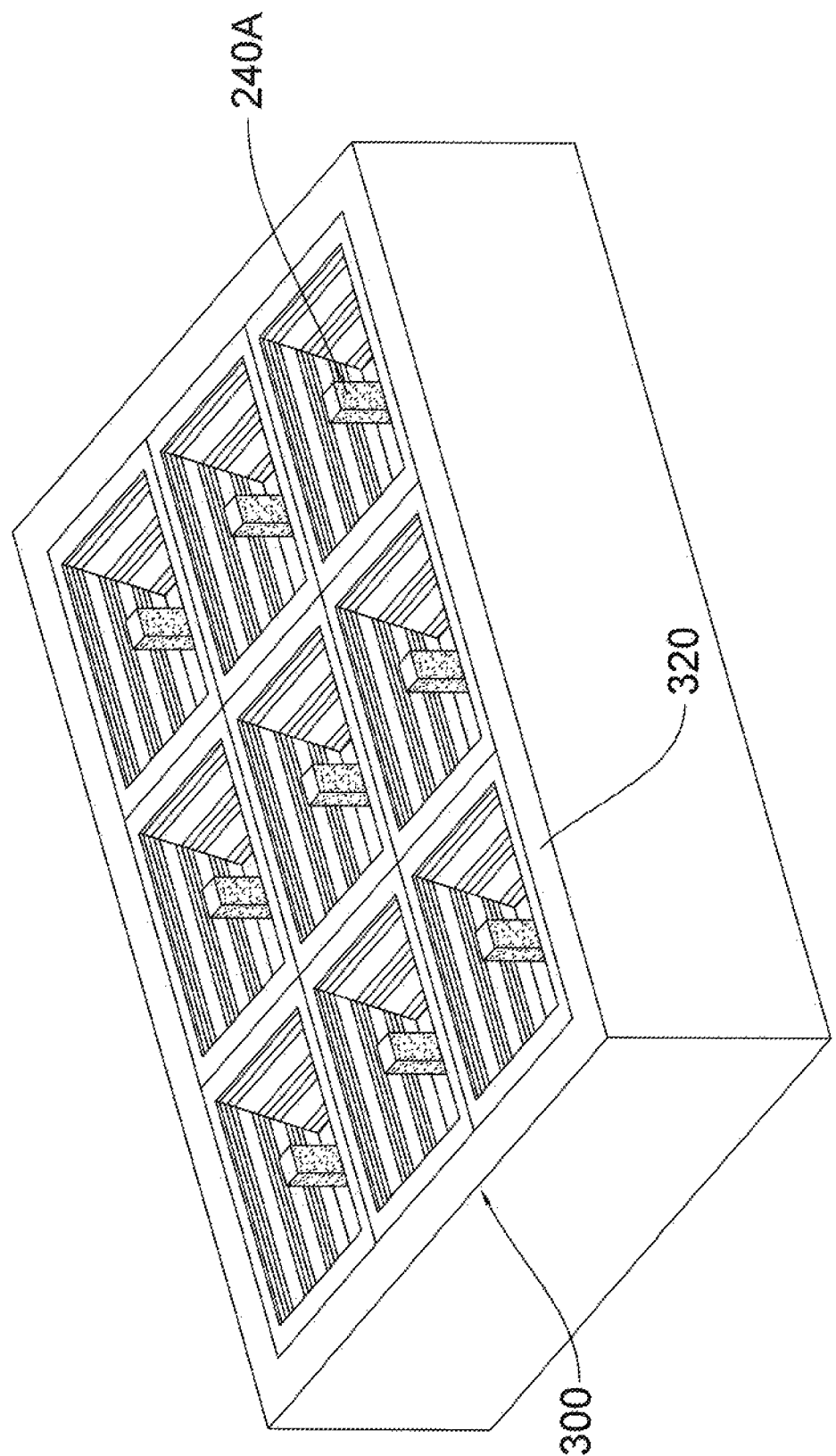
Figure 6A:
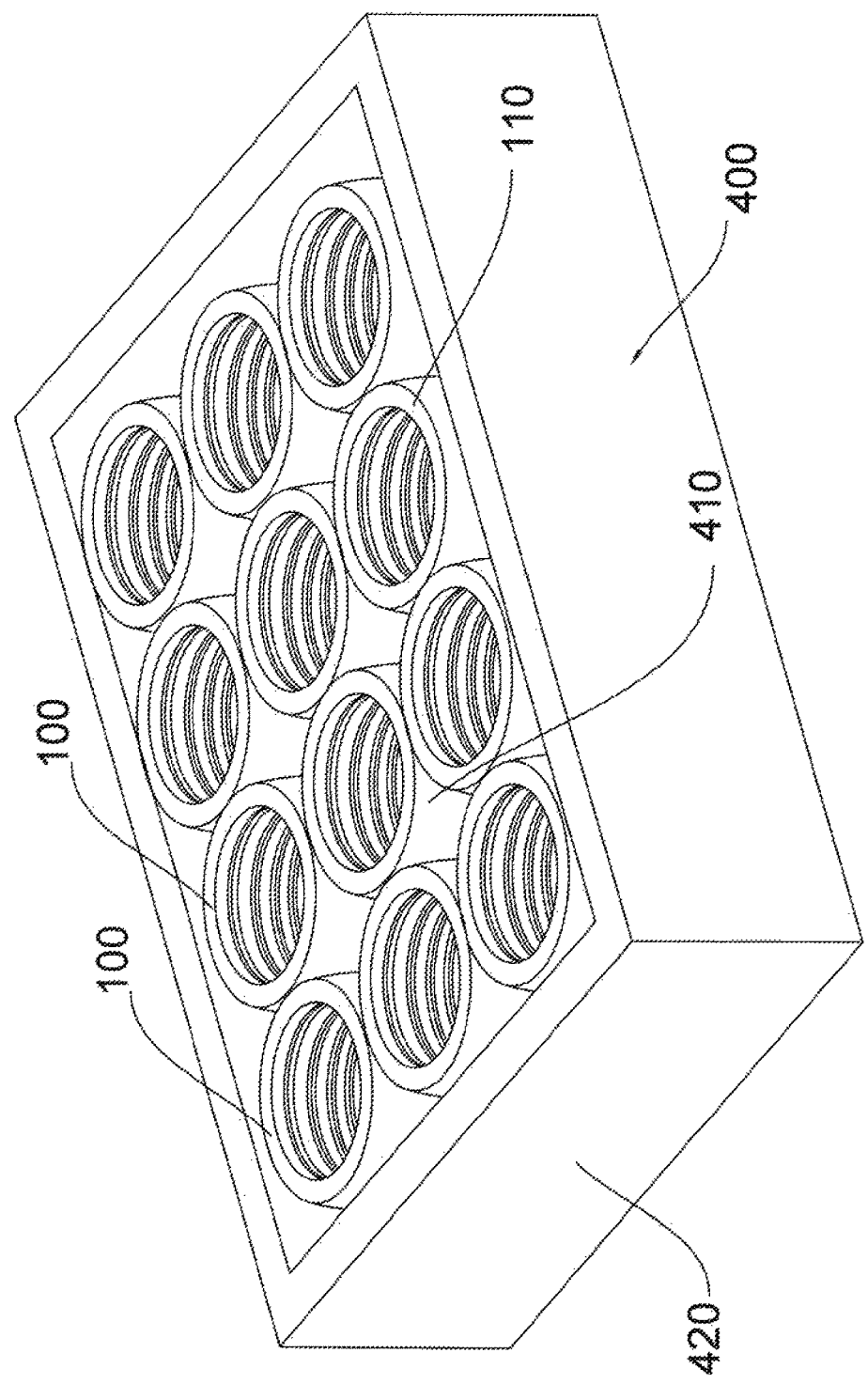
FIGS. 6A-6C illustrate a photovoltaic system according to certain other embodiments.
Figure 6B:
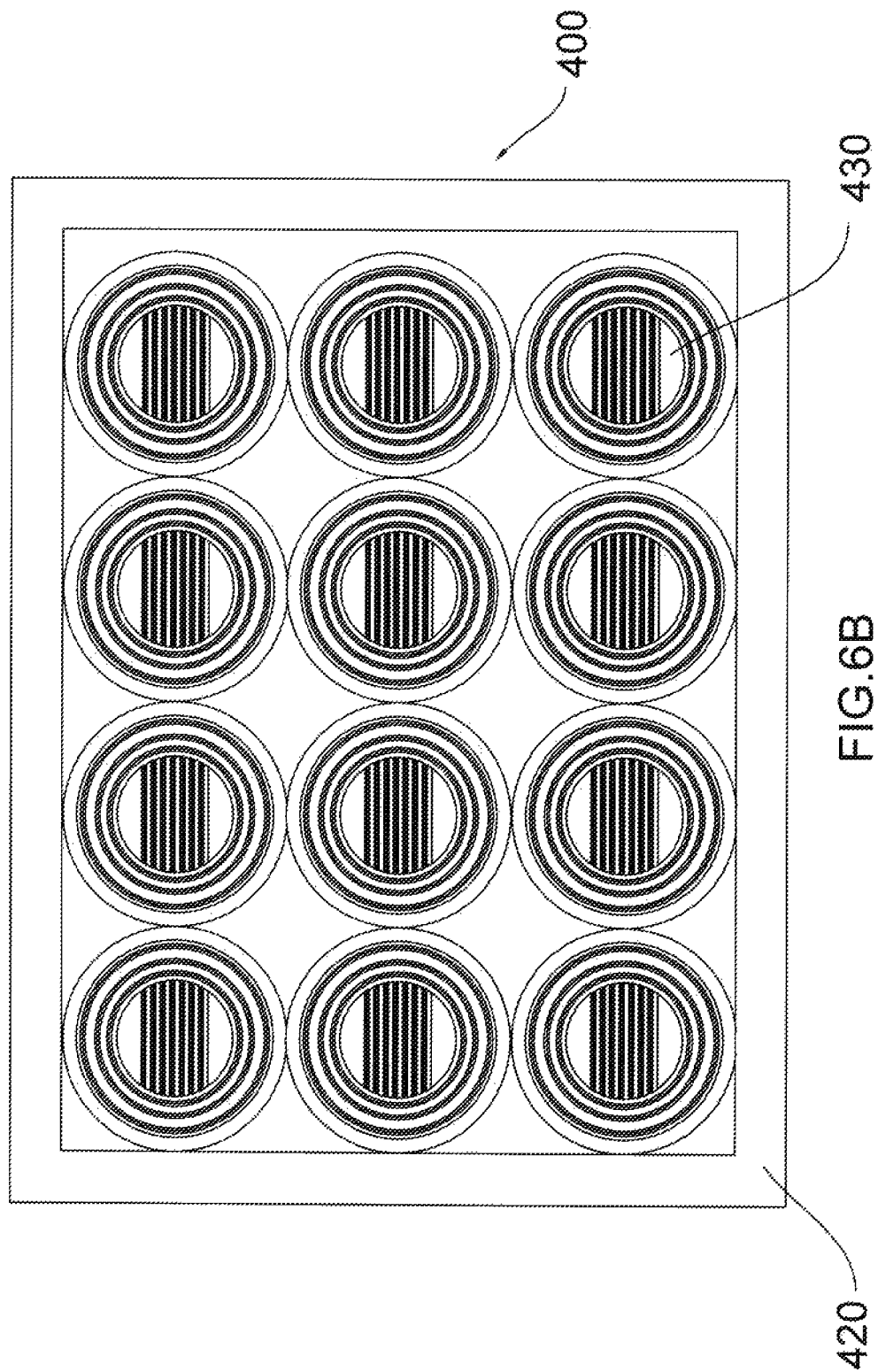
Figure 6C:
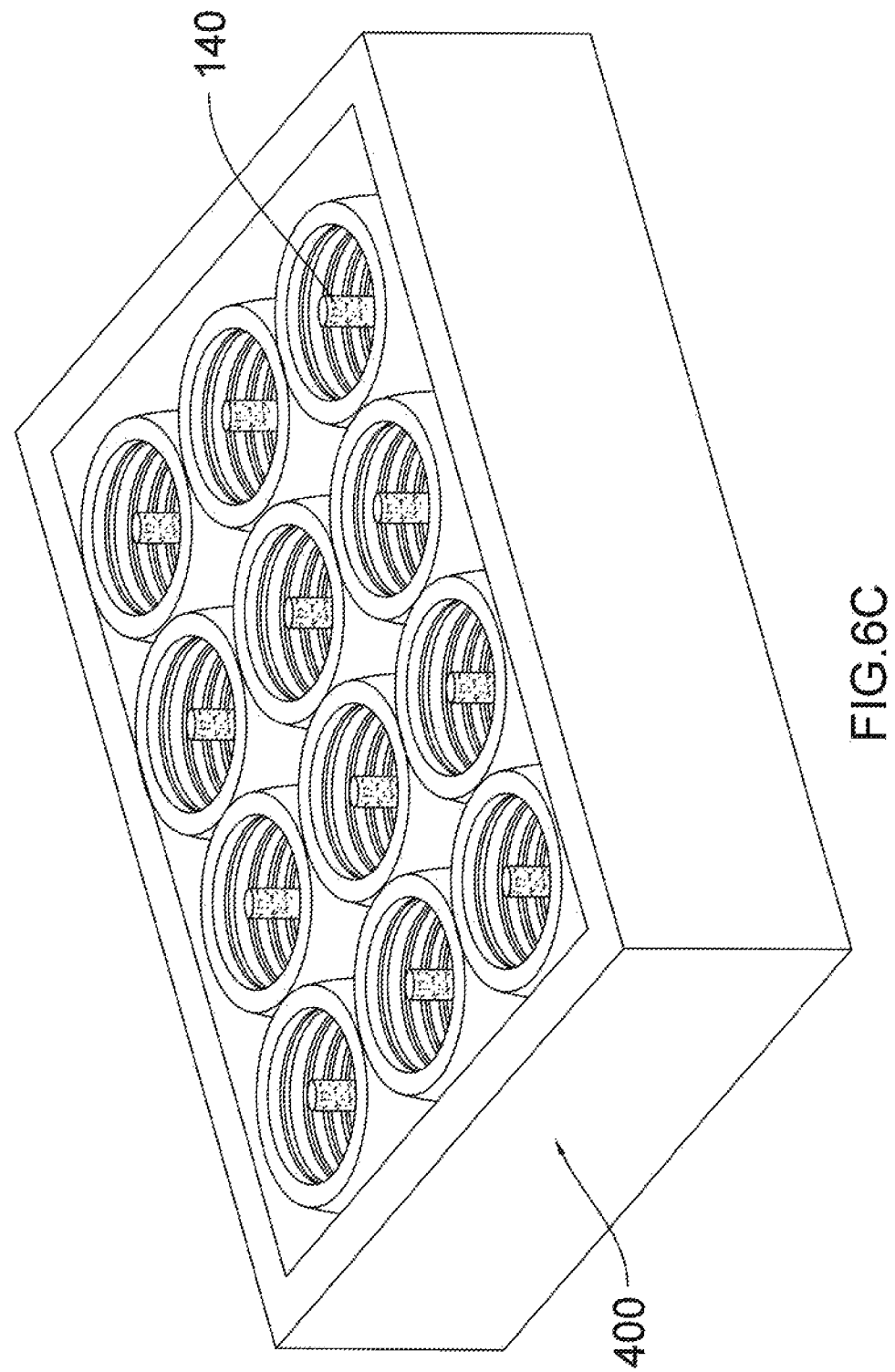

FIGS. 5A-5C illustrate an embodiment of a photovoltaic (PV) system 300. Likewise, FIGS. 6A-6C illustrate another embodiment of a PV system 400. The PV systems 300, 400 include plurality of solar panel modules 100, 200 positioned within a substantially cubical housing 320, 420. FIGS. 6A-6C illustrate the solar panel module 100 comprising a plurality of elongated tubes 110 of FIGS. 1A-1C arranged along the length and width of the housing 420 to give it the structure of honeycomb. FIG. 6C shows central core 140, which is circular in cross-section. FIGS. 5A-5C illustrate the solar panel module 200 comprising a plurality of elongated tubes 210 of FIGS. 2A-2C arranged along the length and width of the housing 320, again, to give it the structure of honeycomb. FIG. 5C shows central core 240A, which is rectangular in cross-section. The modules 100, 200 can be held vertically or in an upright position within the housing 320, 420. According to certain embodiments, solar cells can line along the sidewalls of the housing 320, 420 (not shown).

The modules 100, 200 can be tightly packed within the housing 320, 420 such that there is substantially no spacing between each of the modules 100, 200. The inside surface of one or more sidewalls and the base of the housing 320, 420 can comprise a transparent insulating material. According to certain other embodiments, each of the modules may be separated from an adjacent module by a predetermined spacing. The outside surfaces of each module 310, 410 may also be lined with reflective material in order to optimize energy output from the PV system 300, 400. The base of each module 100 and 200 is provided with a plurality of elongated opening or slits 330, 430 to drain any collected water and also to facilitate cleaning the housing.

In another embodiment, as shown in FIGS. 7A and 7B, a solar panel module 500 includes a tube 510. Multiple arrays of vertically arranged solar cells 520 may be lined along an inner wall of the tube 510. The solar cells may also be arranged as in 1A to 1C. The tube 510 may comprise a conical or funnel-shaped tube. The solar panel module 500 further includes a rotator 530 to facilitate intermittent stimulation of the solar cells. The intermittent stimulation is made possible because light rays very rarely enter the tube 510 in a perpendicular zero degree axis. The rotator 530 is configured to facilitate 360 degree rotation of the tubes along a perpendicular axis, or a 180 degree back and forth oscillation. As shown, in an exemplary embodiment, the rotator 530 may be affixed to a base of the tube 510. The rotator 530 comprises of a motor 540, a disk 550, and a piston 560 connecting the bottom of tube 510 to motor 540 through a hole 570 in disk 550. Other methods known in the art can also be used.

Figure 8:
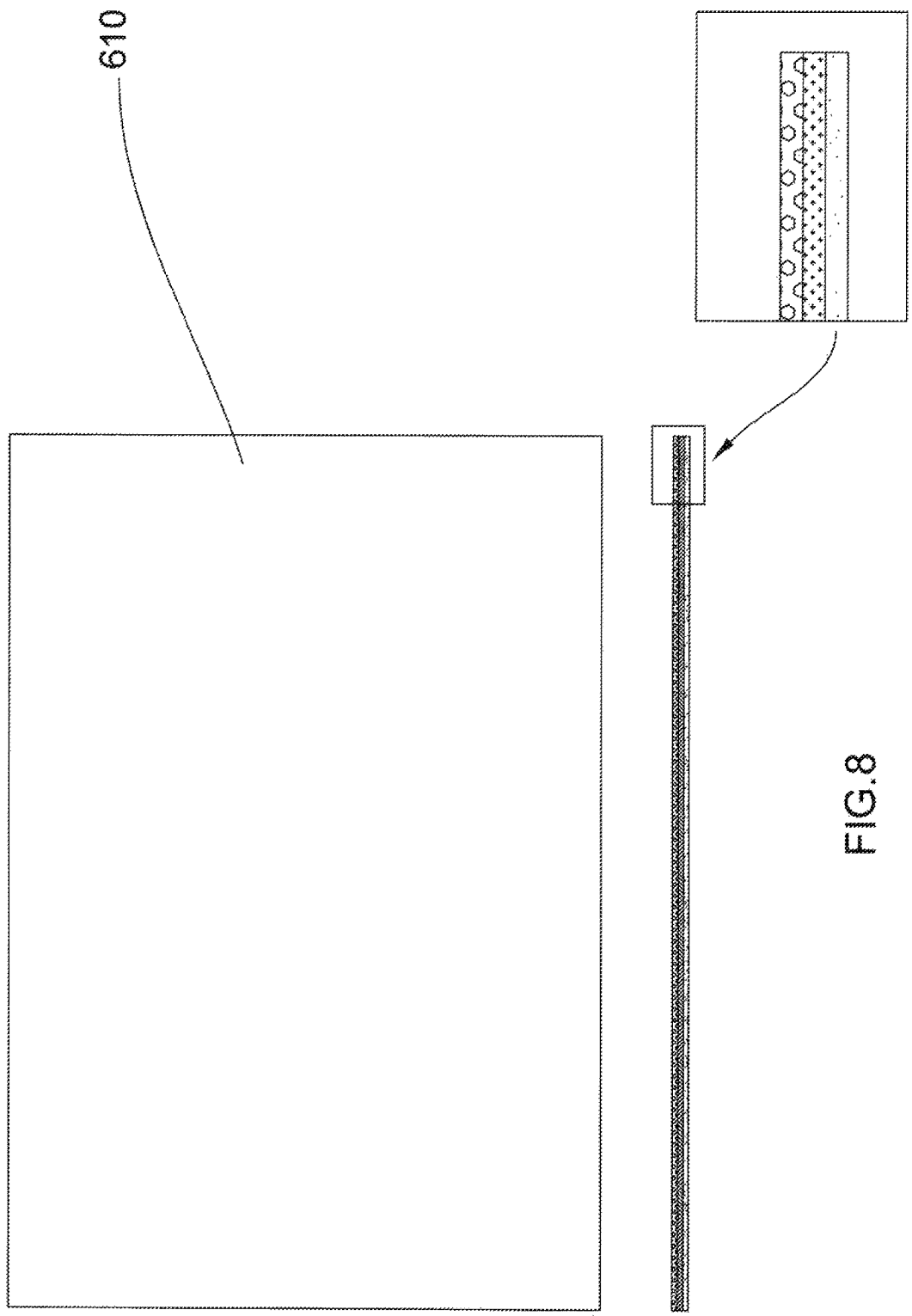
FIG. 8 illustrates a lid for the solar panel module according to certain embodiments.

In certain embodiments, as shown in FIG. 8, the PV system described herein may be provided with a top cover plate or lid 610. The lid 610 comprises a suitable transparent insulating material including, but not limited to, glass or a suitable material that allows the transmission of light. An ultraviolet (UV) or infrared (IR) filter or coating may be further incorporated into the lid 610. Such a filter or coating may advantageously filter out undesirable UV/IR light bands while allowing optimal bands of light to penetrate into the modules, thereby reducing the generation of heat. The lid 610 may include an electrochromatic layer to facilitate intermittent stimulation of the solar cells. The lid 610 may also have a layer to augment incident light.

Figure 9G:
FIGS. 9F-9G illustrate various views of a central solar microtubule shown in FIG. 9C according to certain embodiments.
Figure 9F:

FIG. 9E illustrates a photovoltaic system 700. As shown in FIGS. 9A-9E, the photovoltaic system 700 includes a plurality of solar panel modules 710A and 710B (together 710). Solar panel module 710 comprises a funnel-shaped tubular panels (as described earlier). However, it would be obvious to a person skilled in the art that the solar panel can also include pyramidal tubular panels. The solar panel modules 710 can be supported by a support member 760. The support member may include a plate made of a suitable material. In one embodiment, the solar panel module 710A may include solar cells lined along an inside surface of the tubular module 720. A cylindrical core 730 may be positioned within the solar panel module 710A. The core 730 may be made of a suitable reflective material. The solar panel module 710A may include one or more light amplifiers 740 positioned along an inside surface at desired intervals to increase the energy output. Light amplifiers are known in the art. In another embodiment, the solar panel module 710B includes solar cell arrays 720 lined along the entire length of the panel and/or a portion thereof. The solar panel module 710B further includes a microtubule bundle 770 positioned within the tubular panel. The microtubule bundle 770 includes a collection of microtubules 790. Each microtubule 790 includes multiple arrays of solar cells 780 to form a central solar cell bundle. As shown in FIGS. 9F and 9G, the central solar cell bundle 780 may be formed of multiple wedge-shaped solar cell arrays. The panels include solar cells and electrical connections 795. Solar cells may be grouped in a vertical string-like array throughout its entire length. The microtubule 790 can be lined with reflective surfaces inside and outside. The inside coating facilitates internal reflection in the microtubules and the outside coating facilitates internal reflection in the main tubular panel 710B.

Ambient light is received and substantially trapped within the solar panel module 710. The light is received by the solar cells 720, 780 and is substantially converted into electrical energy. The solar panel module 710 comprises a flexible material. As such, solar panel module 710 can be molded along the structure of a dwelling 750, thus allowing the panels to be configured into various shapes.

As seen in FIG. 9E, the solar panel module 710 include a conical inlet and continue in a cylindrical fashion, contoured around the dwelling like pillars. The entire photovoltaic system 700 can be enclosed in stronger fireproof tubes, which can also facilitate irrigation and washing of the panels with water for cooling the system and/or cleaning the system.

FIGS. 10A-12B illustrate various embodiments of a photovoltaic system 800. As shown in FIGS. 10A-10B, the photovoltaic system 800 includes a tube 810 (similar to "tube 110" shown in FIG. 1A). The tube 810 includes a plurality of solar cell arrays 820. The solar cell arrays 820 includes a plurality of solar cells. The tube 810 further includes a core element 830. The core element 830 may be a cylindrical core element (as described previously with reference to "140" FIGS. 2A and 2B). A first or an upper portion of the core element 830 terminates in a conical expanded member 840. The central core and the conical expanded member are coated with reflective material. The conical expanded member 840 facilitates redirection of additional light to the solar cells. The core member can be extended beyond the conical expanded member 840. This second portion of core member can be coupled to a concave mirror or any concave reflective member 860. This second portion of the core member may not be coated with reflective material. The concave mirror 860 is configured to rotate 360 degrees in 24 hours clockwise or anticlockwise depending upon whether it is a southern hemisphere or northern hemisphere and whether the sun is in south or north to the equator. The direction of the mirror rotation will change March 21$^{st}$ and September 21$^{st}$ in such a way that mirror is always facing the sun and the concave mirror 860 will redirect the light on to the solar panel system 800.

Figure 11D:
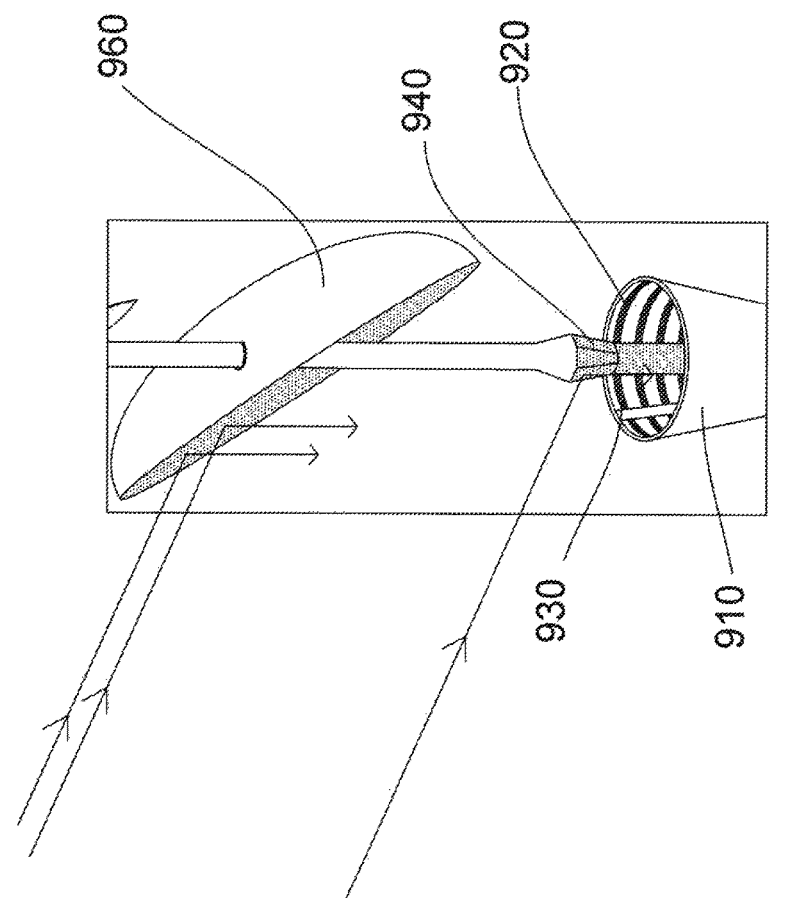
Figure 11C:
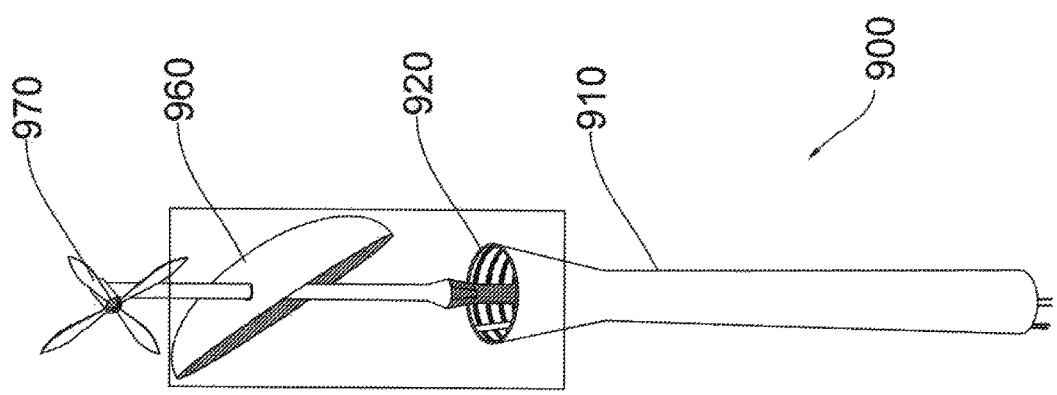

FIGS. 11A-11E illustrate a hybrid photovoltaic system and a wind energy conversion system 900. The photovoltaic system 900 includes a tube 910 (similar to "tube 110" shown in FIG. 1A). The tube 910 includes a plurality of solar cell arrays 920. The solar cell arrays 920 includes a plurality of solar cells. The tube 910 further includes a core element 930. The core element 930 may be a cylindrical core element (as described previously with reference to "140" FIGS. 2A and 2B). A first portion of the core element 930 terminates in a conical expanded member 940. The first portion of the core and the conical expanded member are coated with reflective material. The conical expanded member 940 facilitates redirection of additional light to the solar cells. A second portion of the core element 930 can be extended beyond the conical expanded member 940 to be coupled to a concave mirror or any concave reflective member 960. This second portion of the central core may not be coated with reflective material. The concave mirror 960 is configured to rotate 360 degrees in 24 hours clockwise or anticlockwise depending upon whether it is a southern hemisphere or northern hemisphere and whether the sun is in south or north to the equator. The central core can be extended further so that a wind turbine 970 may be coupled to the solar panel. This second portion of the central core may not be coated with reflective material. A wind turbine 970 may be coupled to the concave mirror 960. As such, the system is a hybrid wind and solar panel system which can ensure an uninterrupted source of electricity. FIGS. 11C-11D show the same view as FIGS. 11A-11B but with the mirror 960 facing in an opposite direction. FIG. 11E is a cross-sectional view of FIGS. 11C-11D. The enlarged view of the bottom section shows a conventional mechanism for combining the DC electricity current generated from the wind turbine 970 and the solar cell array 920. Referring to FIG. 11E, the DC electricity is stored in batteries 980A and 980B for solar and wind energy and is converted to alternating current for immediate use through power inverters 990A and 990B for solar and wind energy. Even if the hybrid system is not making any major contribution towards power produced by a standalone wind turbine or solar panel on their own, a combined power output will be available for end user that can be greater than individual power production of either of them. For example, if the power produced by the wind turbine is 10 KW and by solar cells is also 10 KW, the hybrid system may be able to produce at least 20 KW for the end user.

FIGS. 12A-12B illustrate a photovoltaic system providing supplemental power for a street lighting system 1000. The system 1000 includes a solar panel tube 1010 (similar to "tube 110" shown in FIG. 1A). The tubular panel 1010 includes a plurality of solar cell arrays 1020. The solar cell arrays 1020 include a plurality of solar cells. The tubular panel 1010 further includes a core element 1030. The core element 1030 may be a cylindrical core element (as described previously with reference to "140" FIGS. 2A and 2B). An upper portion of the core element 1030 terminates in a conical expanded member 1040. The central core and the conical expanded member are coated with reflective material. The conical expanded member 1040 facilitates redirection of additional light to the solar cells. The central core can extend upwards to terminate in a light fixture 1080. This portion of the central core may not be coated with reflective material. The light fixture 1080 may be a LED light fixture. The light fixture 1080 may include any geometry. In certain embodiments, as shown, the light fixture 1080 may comprise a disk or halo geometry with a plurality of LED lights. During the day time the solar cell array 1020 generates energy and during night time the light coming down to the light fixture 1080 will supplement the energy production. The enlarged view of the bottom section explains how the DC current generated from the solar cells is converted to usable form. The DC electricity is stored in a suitable battery and is converted to alternating current for immediate use through power inverter 1090. This AC can be supplied as the input for the light fixture 1080, which may have additional AC input as backup.

FIGS. 14A-14D refer to yet another embodiment 1200 of a PV system. As shown, the PV system 1200 comprises a plurality of panels 1210 in a first layer. Second and subsequent layers may include a plurality of units having a cross-shaped geometry 1220. Each of the units may include one or more photovoltaic surfaces 1225, one or more reflective surfaces 1227 or a combination of both surfaces. The panels 1210 and photovoltaic surfaces 1225 on the units may include one or more solar or photovoltaic cells known in the art. The PV system 1200 can be preconfigured or preassembled.

The PV system 1200 comprises a housing 1230. The housing 1230 may include a transparent top or top cover plate/sheet as described in FIG. 8 herein. The top or cover can be made of glass or a suitable material that allows the transmission of light and filter off specific wave lengths and facilitate reflection of incident light inside the housing on to the panels 1210 and cross-shaped units 1220. In one or more embodiments, the top or cover may be coated with a transparent conducting film.

Each of the panels 1210 in the first layer may be connected to an adjacent panel by a transparent or translucent connector. The connectors can be bridge plates or strips or cylinders that are made of glass, polycarbonate or a similar suitable material. The connectors can be coated with an ultraviolet filter and/or an infra-red filter to allow only optimal bands of light to enter into the housing. In one or more embodiments, the bottom surface of the connectors may be coated with a reflector material or coated with a transparent conducting film such that the connectors have a reflective surface underneath.

One or more of the panels in the first panel layer comprises an inverted pyramid-shaped geometry. One or more of the second and subsequent layers comprises one or more spherical or elongate units. The units have an elongated "cross-shaped" geometry. The units having the "cross-shaped" geometry can include photovoltaic surfaces on all surfaces or reflector surfaces or a combination of both. The surfaces can be flat, rectangular, curved or a combination of flat and curved or arcuate surfaces.

The panels in the first layer 1210 and the units in the second or subsequent layer 1220 may be separated from each other by a predetermined gap to facilitate optimal recycling of light. The first unit in a second layer is positioned substantially beneath the gap between a first and second panel in the first layer, and a second unit in the second layer is positioned substantially beneath the gap between the second and a third panel in the first layer. Thus, the units in a second and subsequent layer are arranged in a x+1/x−1, x, x+1/x−1, x . . . series, wherein x=number of panels in the first layer.

Figure 14B:
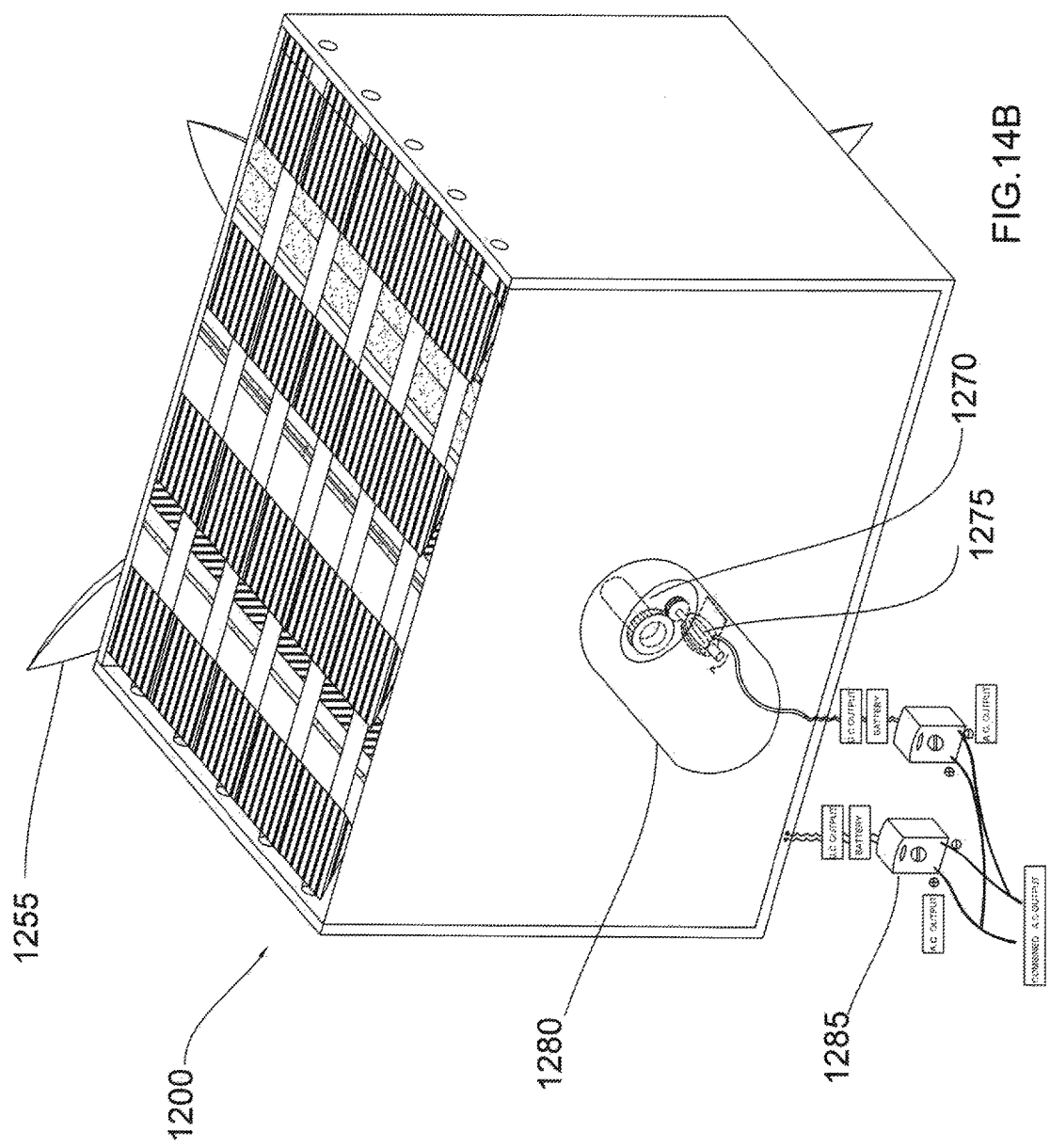
Figure 14C:
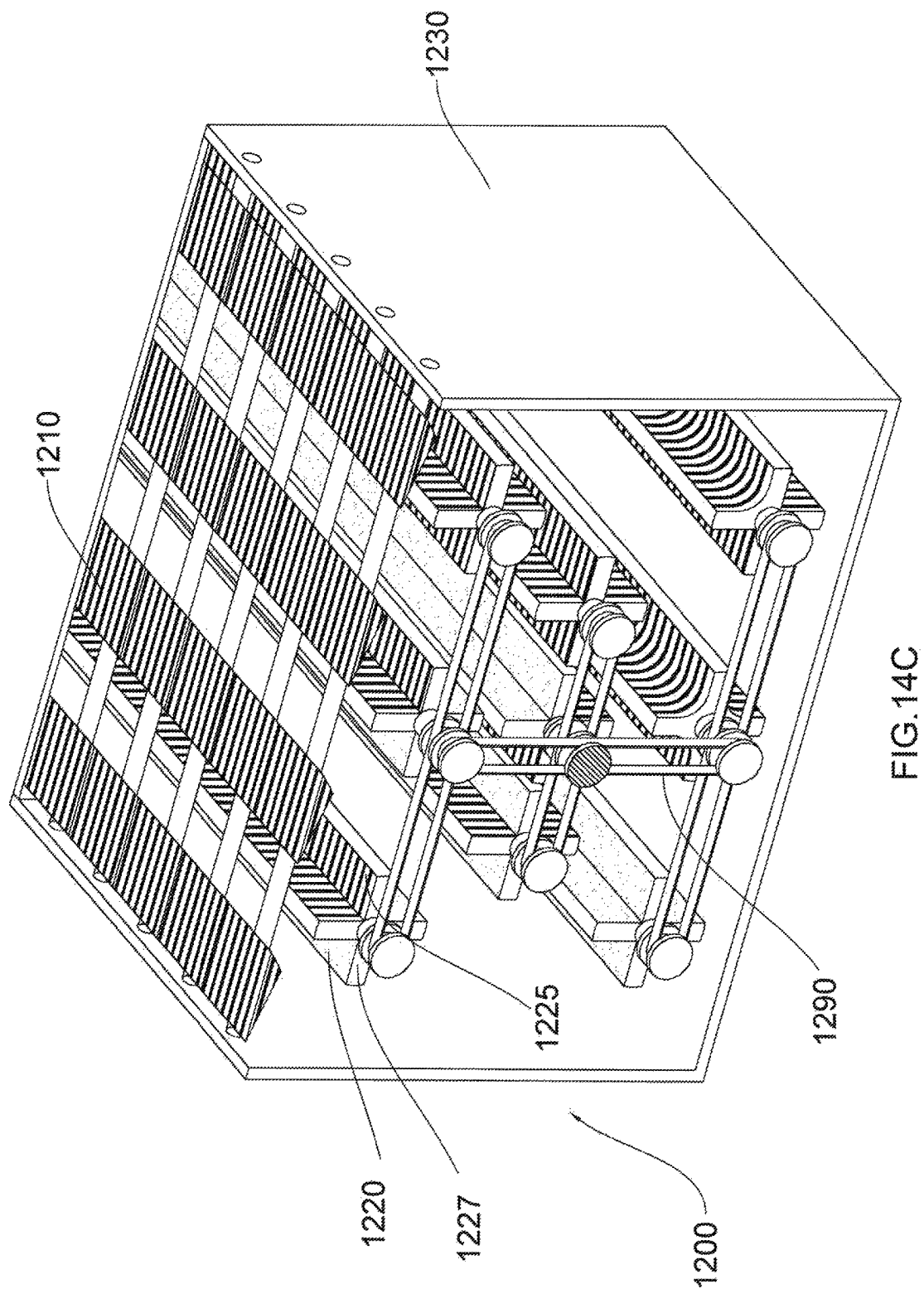
Figure 14D:
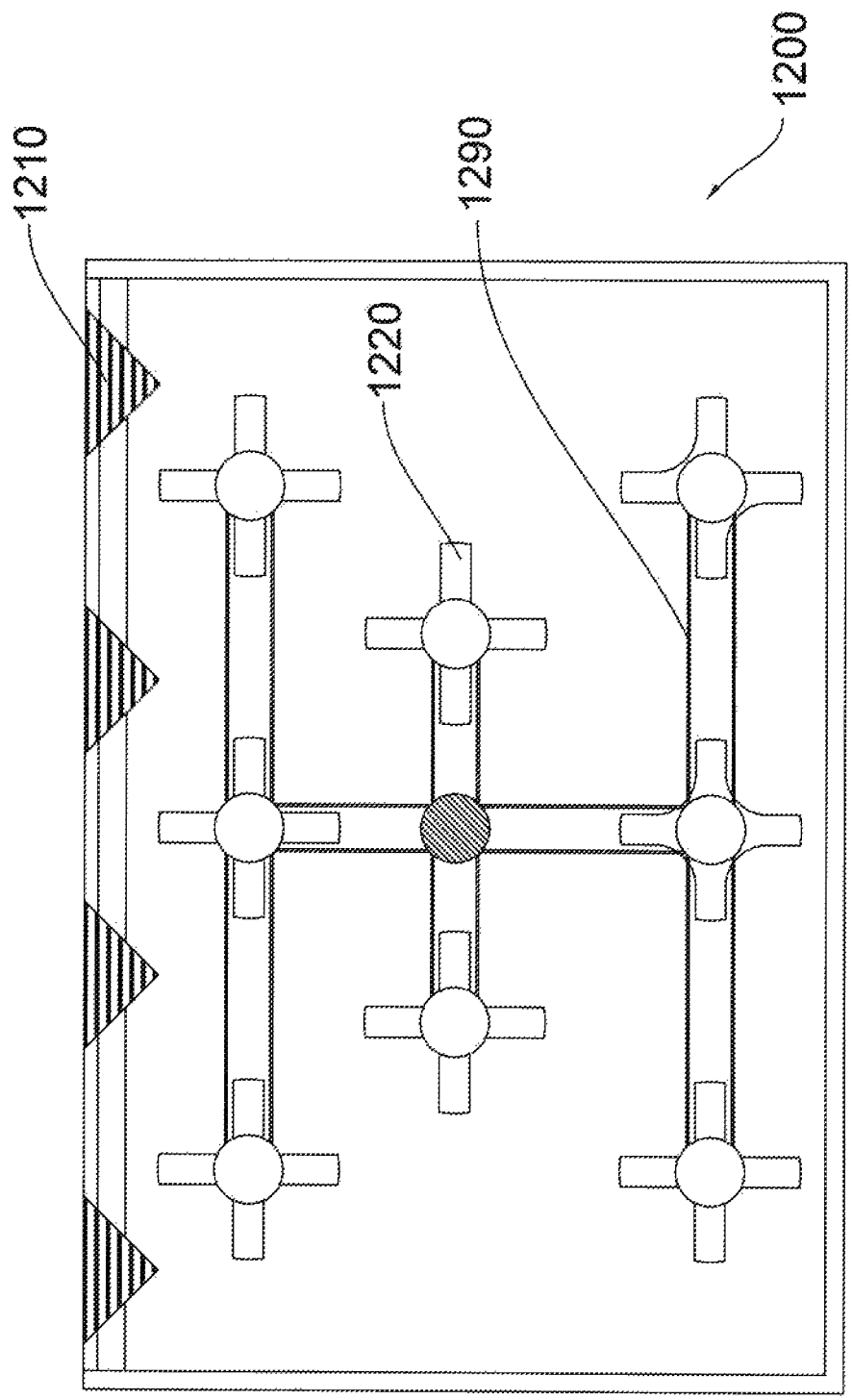

FIG. 13A shows an isometric front view of the PV system 1200 with one large fan 1250 connected to a shaft (not shown) for generating electricity from the wind energy and also driving the other units 1220 through belts (not shown). FIG. 13B shows an isometric rear view of the PV system 1200. The blades 1255 of the fan 1250 are fixed to a hub 1260 at the front end of a shaft 1240 which extends between the front and rear wall of the housing 1230 so that the solid shaft can rotate freely. The rear end of the shaft is connected to a gear box 1270 where the rotation of the shaft can be multiplied by connecting from a large gear to a small gear. The gear box 1270 is connected to a generator 1275. The electrical power generated is proportionate to the size of the fan blades 1255, the rotation of the shaft and the proportion between the large and small gears in the gear box. A transformer may be required to increase or decrease the voltage so it is compatible with the end use, distribution or transmission voltage, depending on the type of interconnection. The gearbox, generator and other components of the turbine are confined in an enclosure or nacelle 1280. The combined energy storage capability in the battery will be greater that either one of them alone. The electricity is converted to alternating current for immediate use through a power inverter 1285. FIG. 13C shows an isometric front view of the PV system 1200 with the front end open to illustrate the the belt connection 1290 from the main fan to the other units 1220. The solid shaft acts as the driver and drives the other shafts. FIG. 14D shows a diagrammatic representation of belt system.

Production of electrical energy may be optimized by providing a photovoltaic system or a hybrid or a combination system according to one or more embodiments. According to an embodiment, an intermittent stimulation of the solar cells may be facilitated by intermittent graded opacification of the top cover plate for the housing utilizing an electrochromatic coating layer, or by any other technique known in the art.

According to an embodiment, the electrical energy generated by the PV system, according to the embodiments described herein, can be collected, stored (for example, in a battery) and distributed through specialized methods already in use. As such, the embodiments of the invention allow a long lasting, environmentally friendly power source.

According to one or more embodiments, there will be more energy output per unit area of the PV system. This may facilitate the widespread use and acceptance of solar technology for consumer, commercial, defense, scientific, space technologies, automobiles, and industrial purposes.

It should be understood that, as used herein, "first," "second," "third," etc., and "top" and "bottom" are arbitrarily assigned and are merely intended to differentiate between two or more solar panels, solar cell arrays, their positions, etc., as the case may be, and does not indicate any particular orientation or sequence. Furthermore, it is to be understood that the mere use of the term "first" does not require that there be any "second," and the mere use of the term "second" does not require that there be any "third," etc.

Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is, therefore, evident that the particular illustrative embodiments disclosed above may be altered or modified and all such variations are considered within the scope and spirit of the present invention. While apparatus and methods are described in terms of "comprising," "containing," or "including" various components or steps, the apparatus and methods also can "consist essentially of" or "consist of" the various components and steps. In particular, every range of values (of the form, "from about a to about b," or, equivalently, "from approximately a to b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an", as used in the claims, are defined herein to mean one or more than one of the element that it introduces. If there is any conflict in the usages of a word or term in this specification and one or more patent(s) or other documents that may be incorporated herein by reference, the definitions that are consistent with this specification should be adopted. From the foregoing description it will be understood by those skilled in the art that many variations or modifications in details of design, construction and operation may be made without departing from the present invention as defined in the claims.

The invention claimed is:

1. A photovoltaic (PV) system comprising:
 a plurality solar panel modules, wherein each solar panel module comprises:
  a first tube, wherein the first tube comprises a substantially funnel-shaped upper segment and a substantially cylindrical-shaped lower segment; and
  a plurality of solar cell arrays arranged inside the first tube, wherein each solar cell array comprises a grouping of solar cells,
 wherein the first tube is configured to bend in multiple directions and angles,
 wherein the first tube facilitates internal reflection and recycling of light within, and
 each of the solar panel modules further includes a bundle of two or more miniature tubes positioned within the first tube, wherein each miniature tube has a substantially smaller diameter than the first tube.

2. The PV system according to claim 1 further comprising a central reflective core.

3. The PV system according to claim 1, wherein the solar panel module comprises one or more light amplifiers positioned along an inside surface of the first tube.

4. The PV system according to claim 1, wherein the solar cell arrays are lined along an entire length of the first tube and/or a portion thereof.

5. The PV system according to claim 1, wherein a second array of solar cells is positioned within each of the miniature tubes.

6. The PV system according to claim 1, wherein the solar cell arrays includes a plurality of wedge-shaped solar cell arrays.

7. The PV system according to claim 5, the second array of solar cells comprises a vertical string-like array throughout an entire length of each of the miniature tubes.

8. The PV system according to claim 1, wherein an inside surface of each of the miniature tubes is coated with a reflective material.

9. The PV system according to claim 1, wherein an outside surface of each of the miniature tubes is coated with a reflective material.

10. The PV system according to claim 1, wherein an inside and an outside surface of each of the miniature tubes is coated with a reflective material to facilitate internal reflection in each of the miniature tubes and internal reflection in the first tube.

* * * * *